United States Patent [19]

Takekuma et al.

[11] Patent Number: 5,668,834
[45] Date of Patent: Sep. 16, 1997

[54] SIGNAL TRANSMITTING DEVICE SUITABLE FOR FAST SIGNAL TRANSMISSION INCLUDING AN ARRANGEMENT TO REDUCE SIGNAL AMPLITUDE IN A SECOND STAGE TRANSMISSION LINE

[75] Inventors: Toshitsugu Takekuma, Ebina; Akira Yamagiwa, Kanagawa-ken; Ryoichi Kurihara, Hadano, all of Japan

[73] Assignee: Hitachi, Ltd., Tokyo, Japan

[21] Appl. No.: 388,990

[22] Filed: Feb. 15, 1995

Related U.S. Application Data

[63] Continuation-in-part of Ser. No. 269,352, Jun. 30, 1994, Pat. No. 5,548,226.

[30] Foreign Application Priority Data

Dec. 28, 1993 [JP] Japan .................................. 5-334631
Feb. 15, 1994 [JP] Japan .................................. 6-018082

[51] Int. Cl.$^6$ .............................. H04B 1/40; H03K 17/16; H03K 19/0175
[52] U.S. Cl. .............................. 375/257; 320/30; 320/86; 333/32
[58] Field of Search .................. 325/257, 219, 325/222, 220; 326/30, 86; 333/32, 24 R, 124, 100; 370/463; 395/280; 364/919, 926, 926.9, 926.91, 926.92, 926.93, 926.94, 926.5

[56] References Cited

U.S. PATENT DOCUMENTS

| | | | |
|---|---|---|---|
| 3,710,282 | 1/1973 | Seinecke | 330/130 |
| 4,922,449 | 5/1990 | Donaldson et al. | 395/280 |
| 4,987,318 | 1/1991 | Burke et al. | 326/90 |
| 5,019,728 | 5/1991 | Sanwo et al. | 326/86 |
| 5,046,072 | 9/1991 | Shimizu et al. | 375/257 |
| 5,227,677 | 7/1993 | Furman | 326/21 |
| 5,548,226 | 8/1996 | Takekuma et al. | 326/30 |
| 5,568,063 | 10/1996 | Takekuma et al. | 326/30 |

FOREIGN PATENT DOCUMENTS 2023503   5/1970   Germany .
545929   12/1993   Japan .

OTHER PUBLICATIONS

"New I/0 Proposal", Fujitsu, JEDEC JC16, San Diego, Dec. 5, 1993, pp. 1–12.
Nikkei Electronics, Nov. 27, 1993, pp. 269–290.

*Primary Examiner*—Wellington Chin
*Assistant Examiner*—William Luther
*Attorney, Agent, or Firm*—Antonelli, Terry, Stout & Kraus, LLP.

[57] ABSTRACT

A signal transmitting device includes a transmitting circuit block having a driving circuit connected to a main transmission line for driving a signal and an intra-block transmission line for transmitting a signal sent from the driving circuit to the main transmission line. The device also includes a receiving circuit block having a transmitting/receiving circuit connected to the main transmission line for receiving a signal inputted from said main transmission line and outputting the received signal to a next stage, an intra-block transmission line for transmitting a signal input from the main transmission line to the transmitting/receiving circuit, a receiving circuit for receiving an output signal from the transmitting/receiving circuit, and a next state intra-block transmission line to enable high-speed signal transmission, the main transmission line includes a termination resistor having s resistance equal to an impedance of the main transmission line and the intra-block transmission line includes an element having a resistance substantially equal to a value derived by subtracting a half of the impedance value of the main transmission line from an impedance value of the intra-block transmission line also, to improve transmission speed along the next-stage intra-block transmission line, a termination resistor is provided from the next-stage intra-block transmission line and the transmitting/receiving circuit and the next-stage intra-block transmission line to produce a voltage drop thereacross.

29 Claims, 22 Drawing Sheets

SIGNAL TRANSMITTING DEVICE SUITABLE FOR FAST SIGNAL TRANSMISSION INCLUDING AN ARRANGEMENT TO REDUCE SIGNAL AMPLITUDE IN A SECOND STAGE TRANSMISSION LINE

CROSS-REFERENCE TO RELATED APPLICATIONS

This is a continuation-in-part of U.S. application Ser. No. 08/269,352 filed Jun. 30, 1994, now U.S. Pat. No. 5,548,226, issued Aug. 20, 1996. The disclosure of that application is incorporated hereinby reference.

BACKGROUND OF THE INVENTION (a) Field of the Invention

The present invention relates to technique of transmitting a signal between elements such as a CPU and a memory device or memory IC (for example, between digital circuits each composed of CMOS elements or functional blocks of CMOS elements), and, more particularly to techniques of quickly transmitting a signal through one bus in which one main transmission line has plural elements connected thereto.

(b) Description of the Prior Art

As a technique of quickly transmitting a signal between digital circuits each composed of a semiconductor integrated circuit, there has been proposed a technique of a low-amplitude interface for propagating a signal having a signal amplitude as low as about 1 volt.

As a representative example of such a low-amplitude interface, a GTL (Gunning Transceiver Logic) interface or a CTT (Center Tapped Termination) interface has been heretofore proposed. These low-amplitude interfaces are discussed in detail in pp 269 to 290 of Nikkei Electronics, Nov. 27, 1993.

FIG. 1 shows a prior art arrangement of such a low-amplitude interface in which one main transmission line has plural branched lines.

A numeral 100 denotes a transmission line terminated by termination power supplies 60 and 61 and termination resistors 50 and 51. The transmission line 100 is connected to a driving circuit block 1 and receiving circuit blocks 2, 3 and 4.

The transmission line 100 has a resistance of 50Ω. Each of branched lines 11 to 14 has a resistance of 50Ω. Each of the terminating resistors 50 and 51 has a resistance of 50Ω. Each voltage of the terminating power supplies 60 and 61 is 0.5 volt. A sending or driving circuit 21 has an on-resistance of 10Ω.

When the driving circuit 21 is at a logical "High" output, the circuit 21 operates to connect a transmission line 11 to a 1-volt power supply (not shown). When the driving circuit 21 is at a logical "Low" output, the circuit 21 operates to connect the transmission line 11 to the ground, that is, a 0-volt power supply (not shown). Numerals 32 to 34 denote receiving circuits included in receiving circuit blocks, respectively. These receiving circuits compare received signals with the reference voltage Vref to determine if the received signal is a Low or High level. In this arrangement, Vref is set at 0.5 V.

Next, a description will be given as to how a signal is transmitted to each point in FIG. 1 on this bus when the driving circuit 21 is switched from the Low output to the High output. At first, a potential of the transmission bus 100 is derived when the driving circuit 21 is at the Low output. The voltage at the point A on the transmission line at this time corresponds to a voltage given by dividing the terminating power source of 0.5 volt by a combined resistor (50/2=25Ω) of the terminating resistances 50 and 51 and the on-resistance (10Ω) of the sending circuit 21. That is, the voltage is derived by:

$$0.5\ V \times 10\Omega/(10\Omega+50\Omega/2)=0.14\ (V)$$

Next, the potential will be derived of the transmission line which occurs when the output of the sending circuit 21 is switched from the Low output to the High output so that a signal is transmitted to a point A of FIG. 1 as follows. Immediately after the output of the sending circuit 21 is switched, the power supply voltage of 1 volt of the sending circuit 21 is divided by the on-resistance (10Ω) of the sending circuit and the resistance 50Ω of the transmission line 11. Hence, the potential boost at the point A is derived by:

$$1\ V \times 50\Omega/(50\Omega+10\Omega)=0.83\ (V)$$

The addition of the initial voltage 0.14 V and the voltage boost, that is, 0.97 V corresponds to the potential at the point A.

The potential occurring when the waveform of the amplitude of 0.83 V reaches the branch point B is derived as follows. If the transmission line 100 is viewed from the transmission line 11, since the transmission line 100 is divided into two, left and right parts, the virtual impedance of the transmission line 100 if viewed from the transmission line 11 becomes a half of an resistance 50Ω of the transmission line 100, that is, 25Ω. On the other hand, since the impedance of the transmission line 11 is 50Ω, the mismatch of the impedance results in bringing about the reflection of a signal at the point B.

The reflective coefficient is derived as follows.

$$(50\Omega-25\Omega)/(50\Omega+25\Omega)=0.33$$

This means that a one-third part of the signal amplitude of 0.83 V transmitted to the point A, that is, a signal of the amplitude 0.28 V is reflected and returned to the sending circuit side. The signal of the left amplitude 0.55 V is transmitted to the transmission line 100 as a first transmitted wave. Hence, the potential of the transmitted signal corresponds to an addition of 0.55 V and the initial potential (0.14 V).

When the signal having the amplitude of 0.28 V returned to the sending circuit reaches the sending circuit, the signal is mirror-reflected and reaches the point B again. A two-third part of the signal passes through the transmission line 100, while the remaining one-third part of the signal is returned to the transmission line 11. According to such an action, the signal travels to and fro on the transmission line 11 again and again. Each time the signal waveform reaches the point B, the two-third part of each waveform is output to the transmission line 100. By this operation, the amplitude of 0.83 V originally at the point A is dividedly transmitted to the transmission line 100 bit by bit.

The signal of 0.69 V which passed through the point B and transmitted to the transmission line 100 reaches the point C. At this point, two transmission lines are each made to have a resistance of 50Ω before the passage of the signal. Hence, the mismatch of the forward synthesized resistance 25Ω to the resistance of 50Ω of the transmission line on which the signal has passed results in bringing about the reflection of the signal.

The reflective coefficient is as follows:

(50Ω−25Ω)/(50Ω+25Ω)=0.33

The potential of the waveform passed through the point C corresponds to a potential derived by multiplying the signal amplitude of 0.55 V at the point B by a transmittance $\frac{2}{3}$ (=1⅓) and adding the initial potential to the multiplied value. That is, 0.55 V×⅔+0.14 V=0.50 (V)

A similar reflection takes place at the point E or the point G. The potential at the point E is 0.38 V and the potential at the point G is 0.30 V.

These results are shown in FIGS. 2A to 2C. FIG. 2A shows signals which come to and go out of the point C, that is, a signal of the point B coming to the point C and signals of the point D and the point E going out of the point C. For explaining them clearly, the signal at the point A is shown as well. Likewise, FIG. 2B shows signals which come to and go out of the point E. FIG. 2C shows signals which come to and go out of the point G. In FIGS. 2A to 2C, a numeral 201 denotes a signal waveform at the point A in FIG. 1. A numeral 202 denotes a waveform at the point B. A numeral 203 denotes a waveform at the point C. A numeral 204 denotes a waveform at the point D. A numeral 205 denotes a waveform at the point E. A numeral 206 denotes a waveform at the point F. A numeral 207 denotes a waveform at the point G. A numeral 208 denotes a waveform at the point H. When the signal falls, the same thing takes place. The signal waveforms at the drop of the signal are as shown in FIGS. 3A to 3C. In FIG. 3, numerals 201 to 208 denote signal waveforms at the point A to the point H shown in FIG. 1, respectively.

From the situation described above, it is understood that the use of the conventional signal transmitting circuit makes it impossible to allow the first signal at the point A indicating a High level from the driving circuit 21 to exceed the reference voltage $V_{ref}$ (0.5 V in the above condition) at all of the receiving circuit blocks for establishing that the signal is at the High level. In other words, due to the large degree of reflection at the various points B, C, E and G, the original High level voltage at the point A for the first signal is attenuated to very low levels of voltage that will not exceed the reference voltage Vref at the receivers. Therefore, even though the sending circuit 21 is indicating a High level, the receivers 32, 33 and 34 will not be able to recognize this for the first signal. Eventually, after repeated signals, the level of voltage at points B, C and D will increase to levels much closer to the level at point A, but, until this occurs, the receivers will not be able to recognize the high level.

The signal entering each branched line at the branch point C, E or G, like the transmission line 11, is reflected over and over inside of the branched line. When the reflected waveform returns to the branch point, the two-third part of the signal goes to the transmission line 100. This brings about a waveform distortion on the transmission line 100.

As mentioned above, in the foregoing prior art, the reflections take place at each branch point. The potential drops resulting from the reflections are overlapped with each other. Hence, the rise of the signal potential is delayed in a remote place of the driving circuit. This results in disadvantageously increasing the delay time, and thereby prevents quickly transmitting the signal.

Further, the signal entered into the receiving circuit block is reflected in the receiving circuit part and then goes into the transmission line 100. This also results in disadvantageously distorting the signal waveform, thereby lowering the reliability of the signal transmission.

To speed up the signal transmission and make the signal amplitude on the line 100 smaller, the above prior art is arranged so that the supply voltage is 1 V. In the circuit discussed in the aforementioned paper, to achieve an amplitude of 1 V at the normally used power supply of 3.3 V, the driving circuit is arranged to give about 100Ω to its on-resistance for realizing a small amplitude.

Since the on-resistance of the currently widely available sending circuit is about 10Ω, a novel sending circuit is required to use the technique described in the above-mentioned paper and the conventional sending circuit is not used.

Further, such a higher on-resistance given to the sending circuit 21 leads to increasing the power consumption of the driving circuit, thereby disadvantageously increasing the overall power consumption.

As another known prior art arrangement relevant to the present invention, U.S. Pat. No. 4,922,449 to Donaldson et al may be referred to. This U.S. Patent discloses a technique of providing a resistor between a circuit block and an inter-block signal transmission line in a circuit line structure having plural circuit blocks containing a driving circuit and a receiving circuit and the inter-block signal transmission line for propagating a signal between the circuit blocks. The object of providing the resistor between the circuit blocks is for reducing passage current appearing at the time of signal collision by the source switching operation, that is, reducing the amplitude of the signal on the inter-block signal transmission bus. The resistance is set as 20Ω to 40Ω. This resistance may bring about a signal reflection at a branch point between the transmission line inside of the circuit block and the inter-block transmission line. The signal reflection may disadvantageously inhibit the realization of fast signal transmission. That is, this technique does not define any resistance based on a relation of an impedance between the inter-block signal transmission line and the signal transmission line inside of the block.

Moreover, another prior art arrangement which provides a resistor between an inter-block signal transmission line and a signal transmission line inside of the circuit block is disclosed in JP-B-54-5929. In this prior art arrangement, a resistor is provided only between the circuit block on the side of the receiving circuit and the inter-block signal transmission line, but no resistor is provided between the circuit block provided with a sending circuit and the inter-block signal transmission bus. Like U.S. Pat. No. 4,922,449, a signal reflection takes place when the signal outputted from the driving circuit is transmitted onto the inter-block signal transmission bus. As in the previously described arrangement, this signal reflection may disadvantageously inhibit realization of fast signal transmission.

SUMMARY OF THE INVENTION

The applicant discloses the technique for solving the above problems by the U.S. patent application Ser. No. 08/269,352 now U.S. Pat. No. 5,548,226 (German Patent Application No. P4426841.6. Chinese Patent Application No. 94114924.2).

More particularly, the technique discloses a signal transmitting device including a first circuit block (transmitting circuit Unit) having a driving circuit for driving a signal and an intra-block transmission line for transmitting a signal outputted from the driving circuit to the outside of the circuit block, a second circuit block (receiving circuit unit) having a receiving circuit for receiving a signal and an intra-block transmission line for transmitting a signal inputted to the receiving circuit, and an inter-block transmission line (main transmission line) for transmitting a signal between the circuit blocks, in which the inter-block transmission line is terminated by an element having a resistance equal to or close to a characteristic impedance value of the inter-block transmission line, and an element (matching resistor) having a resistance equal to or close to a value derived by subtracting a half of the impedance of the interblock transmission line from an impedance of the intra-block transmission line is provided between the intra-block transmission line and the inter-block transmission line.

According to the above technique, the resistor having the resistance close to a value derived by subtracting a half of the impedance of the inter-block line (bus) from the impedance of the inter-block line (branched line) is inserted between the branched line and the bus, so that repetitive reflections of signals in the branched line can be prevented and an amplitude of a signal on the transmission line can be made small by means of the voltage division by the inserted resistor and the termination resistor to thereby enabling a high-speed signal transmission.

However, the receiving circuit unit sometimes includes receiving circuits connected through a next-stage transmission line to an output of the receiving circuit connected to the main transmission line.

For example, an address signal circuit of a memory module includes such receiving circuits. An address signal supplied to the memory module is once inputted to a driver circuit and then supplied from the driver circuit to an input circuit of a memory LSI in the memory module.

In such a circuit, termination of the main transmission line and addition of the matching resistor to the intra-block transmission line can make small an amplitude of a signal in an interface of the main transmission line, while it is difficult to transmit a signal in an interface of the next-stage transmission line at a high speed since the amplitude of the signal in the interface of the transmission line is left large. Accordingly, the high-speed transmission of signals in the whole device is difficult because it is limited by the signal transmission speed on the next-stage transmission line.

It is an object of the present invention to provide a signal transmitting device capable of making an amplitude of a signal small and transmitting the signal at a high speed even in an arrangement having a multi-stage receiving circuit in which receiving circuits are further connected through a next-stage transmission line to an output of a receiving circuit.

In order to achieve the above object, a signal transmitting device includes a transmitting circuit block having a driving circuit connected to a main transmission line for driving a signal and an intra-block transmission line for transmitting a signal sent from the driving circuit to the main transmission line, and a receiving circuit block having a transmitting/receiving circuit connected to the main transmission line for receiving a signal inputted from the main transmission line and outputting the received signal to a next stage, an intra-block transmission line for transmitting a signal inputted from the main transmission line to the transmitting/receiving circuit, a receiving circuit for receiving a signal outputted from the transmitting/receiving circuit, and a next-stage intra-block transmission line for transmitting a signal between the receiving circuit and the transmitting/receiving circuit, wherein the main transmission line includes termination resistors each having a resistance equal to an impedance of the main transmission line and the intra-block transmission line includes an element having a resistance equal to or close to a value derived by subtracting a half of the impedance value of the main transmission line from an impedance value of the intra-block transmission line, the next-stage intra-block transmission line including termination resistors, and an element is provided between the transmitting/receiving circuit and the next-stage intra-block transmission line to produce a voltage drop thereacross.

The main transmission line constituting the inter-block transmission line is terminated by elements each having a resistance equal to or close to the impedance value of the main transmission line, and an element having a resistance equal to or close to a value derived by subtracting a half of the impedance value of the inter-block transmission line from the impedance value of the intra-block transmission line is provided in the intra-block transmission line, so that a signal having a small amplitude divided by the termination resistors of the main transmission line and the element provided in the intra-block transmission line (branched line) is transmitted on the main transmission line and repetitive reflections of signals in the intra-block transmission line can be prevented by the element provided in the intra-block transmission line to thereby enabling the high-speed signal transmission in the transmission line having the branched lines.

Further, the element inserted between the output of the transmitting/receiving circuit and the next-stage intra-block transmission line and the termination resistors connected to the next-stage intra-block transmission line can make the amplitude of the signal on the intra-block transmission line small and attain the high-speed signal transmission.

In addition, values of the element provided between the output of the transmitting/receiving circuit and the next-stage intra-block transmission line and the termination resistors of the next-stage intra-block transmission line can be set so that the signal amplitude on the inter-unit transmission line can be set to be equal to or close to the signal amplitude on the next-stage intra-block transmission line, so that the same interface system can be used in both the transmission lines.

DESCRIPTION OF THE REFERRED EMBODIMENTS

Embodiment of the present invention will be described in detail with reference to the accompanying drawings.

Figure 1:
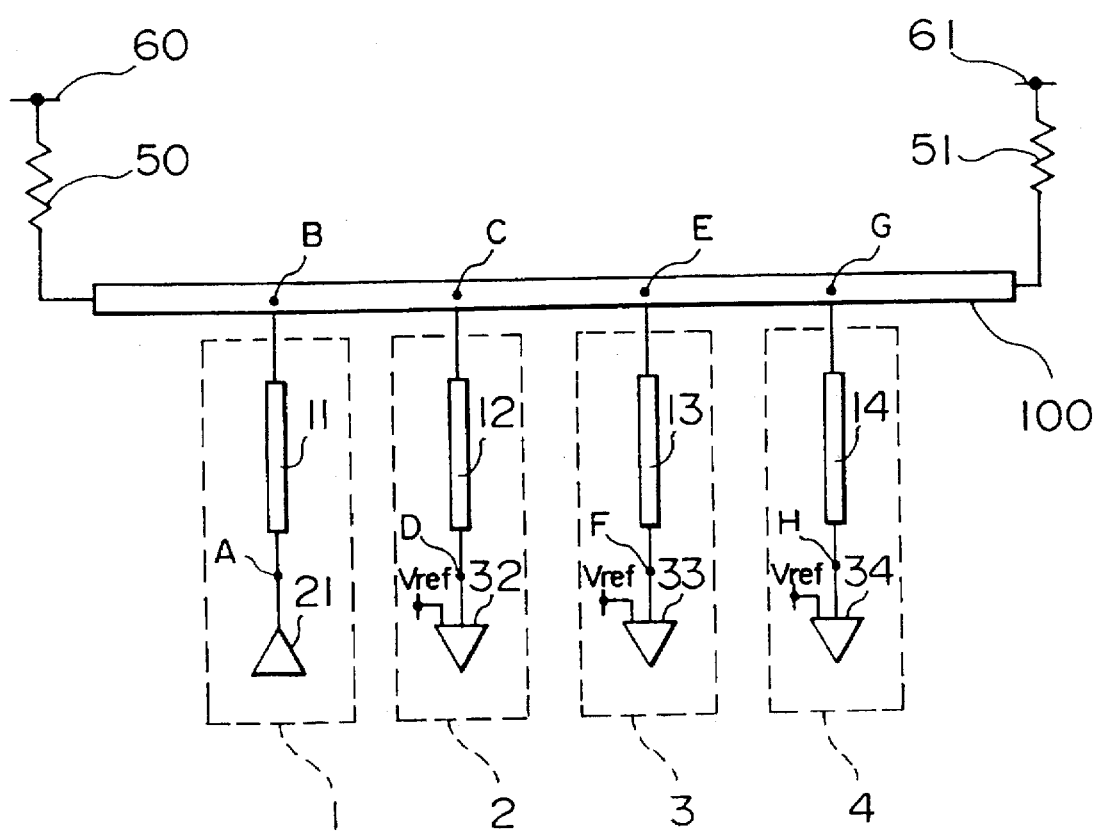
FIG. 1 is a diagram showing a conventional unidirectional transmission line.
Figure 2A:
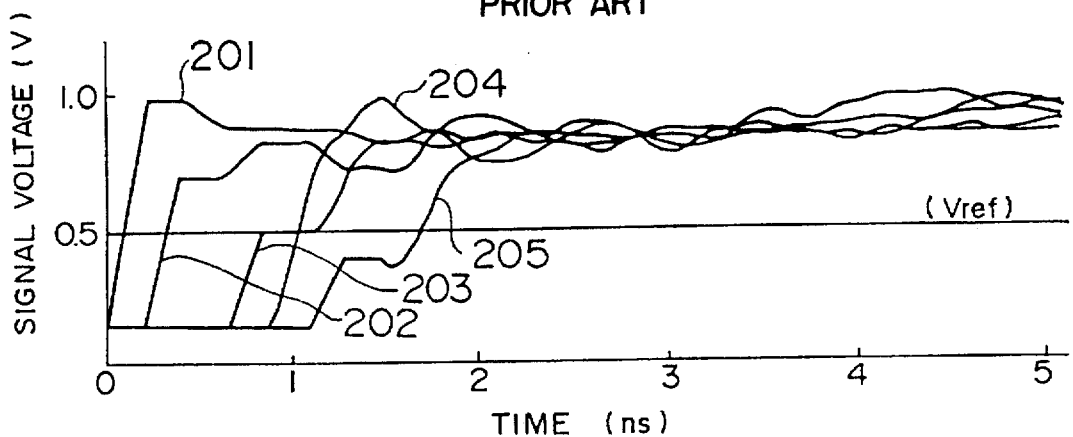
FIGS. 2A to 2C are charts showing signal waveforms (leading waveforms) appearing in the case of using the conventional transmission line.
Figure 2B:
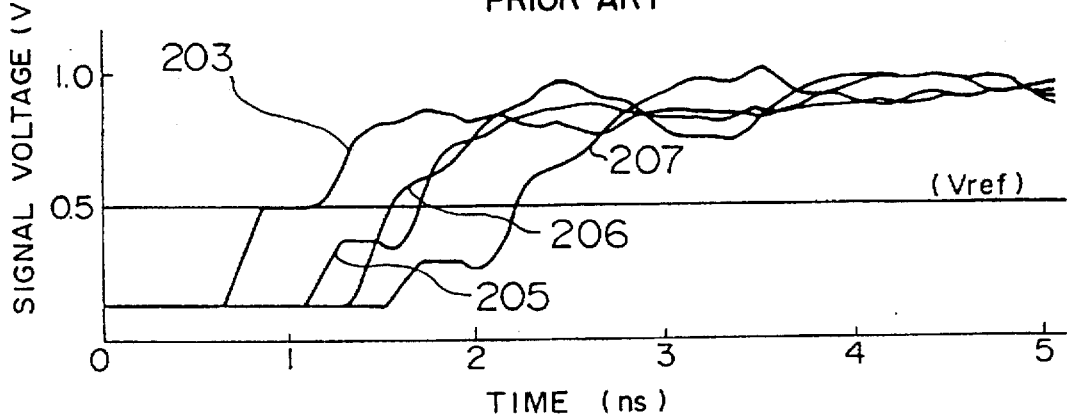
Figure 2C:
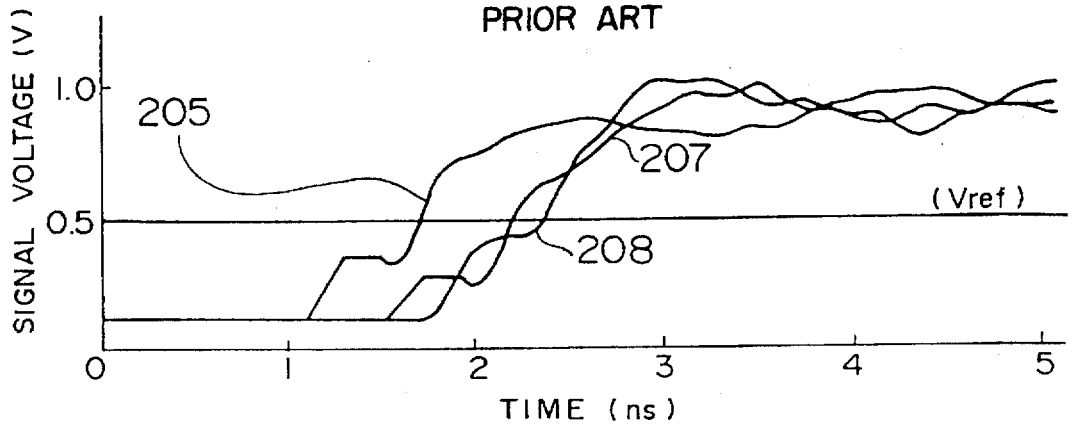
Figure 3A:
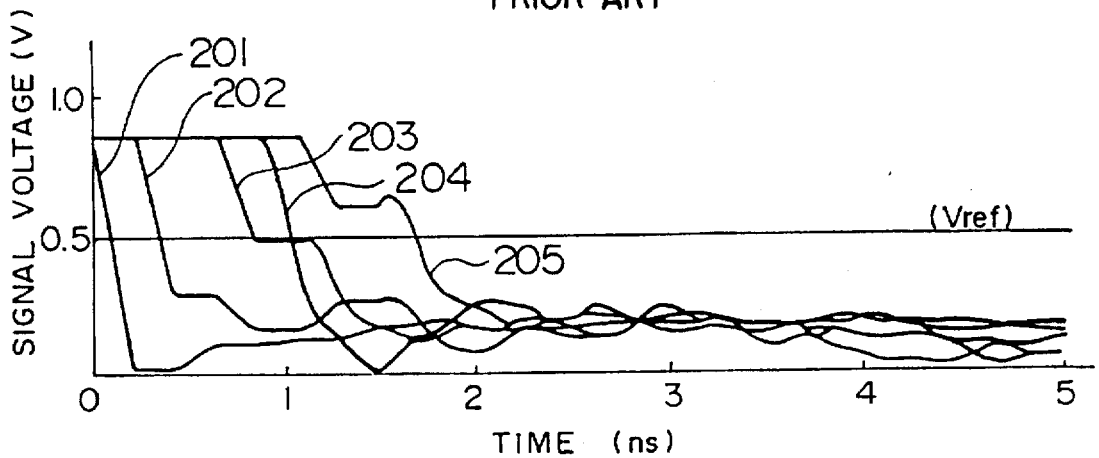
FIGS. 3A to 3C are charts showing signal waveforms (tailing waveforms) appearing in the case of using the conventional transmission line.
Figure 3B:
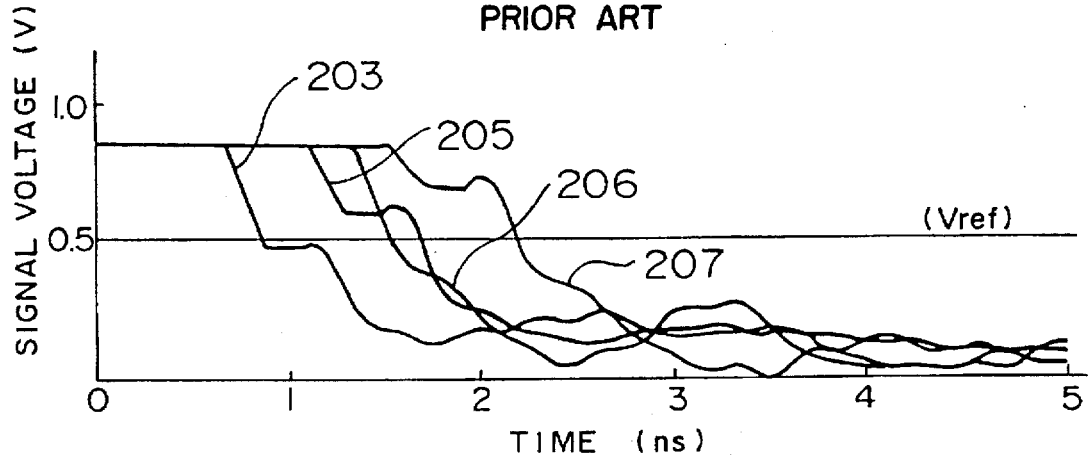
Figure 3C:
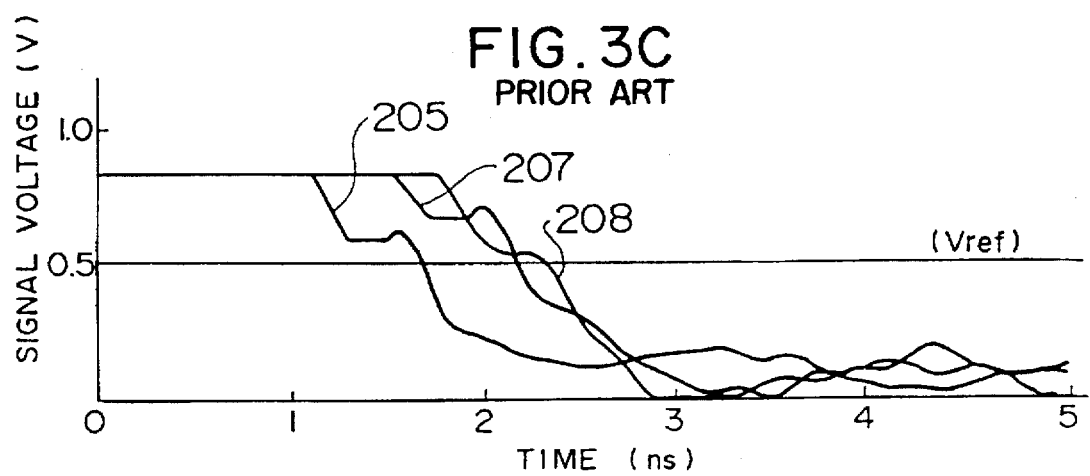
Figure 4:
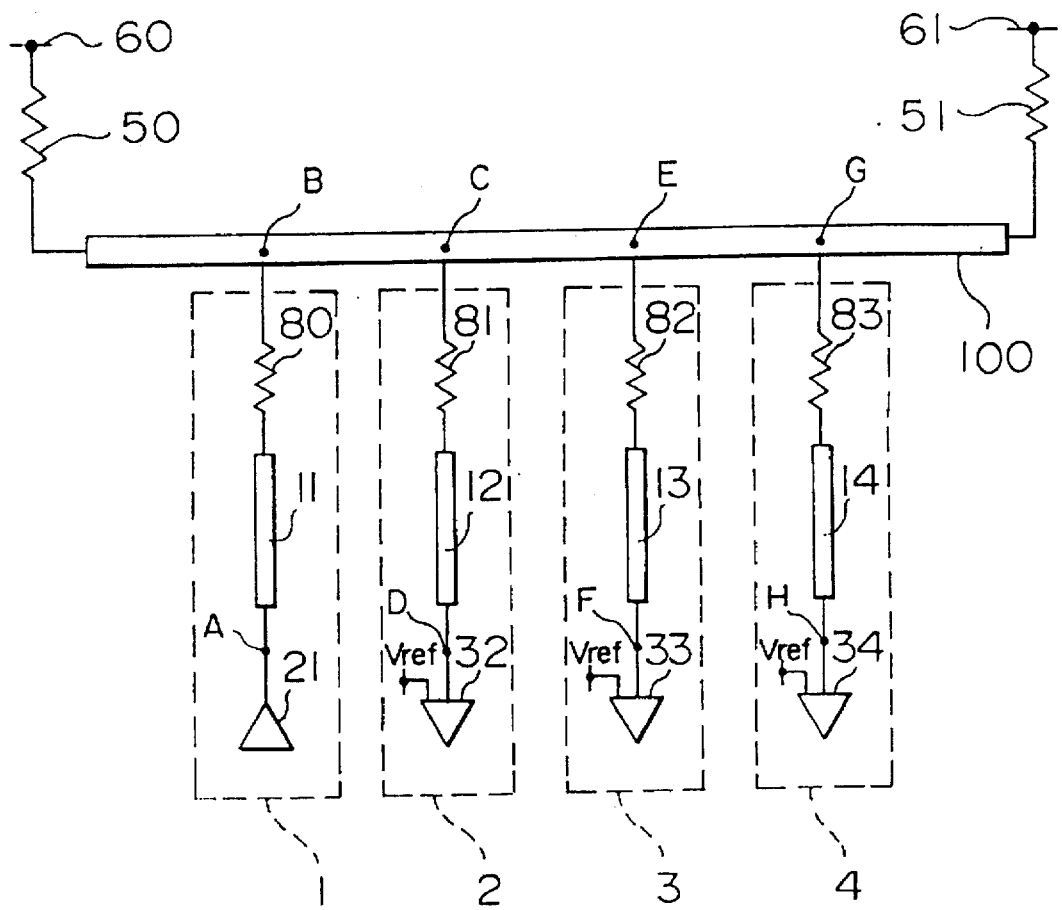
FIG. 4 is a block diagram showing an embodiment 1 of the present invention.

FIG. 4 shows in fundamental block diagram, a first embodiment of a unidirectional transmission line to which the present invention is applied.

In FIG. 4, a numeral 1 denotes a driving circuit block (unit) having a driving circuit 21. Numerals 2 to 4 denote receiving circuit blocks provided with receiving circuit 32 to 34, respectively. The circuit blocks include resistors 80 to 83 and transmission lines 11 to 14, respectively. A transmission line 100 is connected to the circuit blocks 1 to 4, and both ends of the transmission bus 100 are terminated by the resistors 50 and 51, each having a resistance equal to or close to a characteristic impedance value of the transmission line 100.

In FIG. 4, the transmission line 100 has a resistance of 50Ω. The branched lines 11 to 14 each have a resistance of 100Ω. Each of the termination resistors 50 and 51 has a resistance of 50Ω. Terminating power supplies 60 and 61 operate to supply a voltage of 1.5 V. The driving circuit 21 has an on-resistance of 10Ω.

The driving circuit 21 operates to connect a transmission line to a 3 V-power supply (such as 62 in FIG. 5) when the driving circuit 21 holds the output at logical "High" or connect the transmission line to a ground potential (such as 63, in FIG. 5) when the driving circuit 21 holds the output low. In FIG. 4, numerals 32 to 34 denote receiving circuits.

The resistors 80 to 83 are each defined to have a resistance of 75Ω. The method of defining the resistance will be described later.

It is noted that in this embodiment, the transmission line 100 is terminated at both of the ends. However, it may be terminated at one end by just one resistor, if preferred. Further, this embodiment provides three receiving circuit blocks each having a receiving circuit. However, the present invention is applicable to a signal transmission device including at least one block having the receiving circuit.

Figure 5:
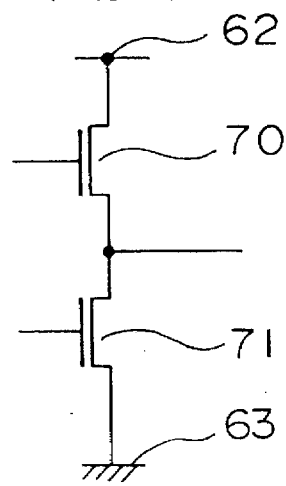
FIG. 5 is a circuit diagram showing an example of a driving circuit.

FIG. 5 shows an example of the sending or driving circuit 21 used in the arrangement of FIG. 4. This driving circuit 21 is a push-pull driving circuit composed of a pull-up transistor 70 and a pull-down transistor 71.

The pull-up transistor 70 shown in FIG. 5 is made of an N-channel MOS field-effect transistor (NMOS). The material of the transistor 70 is not limited to NMOS. For example, a P-channel MOS field-effect transistor (PMOS) may be used for making the transistor 70.

A low-amplitude driving circuit provided with the push-pull driving circuit is discussed in detail in the Nikkei Electronics paper referred to previously as a prior art arrangement. In this paper, however, the driving circuit uses a transistor with as high an on-resistor as about 100Ω. On the contrary, the present invention uses a transistor with an on-resistance of about 10Ω which is now widely available. The present invention may use the conventional driving circuit, because the sum of on-resistance of the resistors 80 to added in this embodiment and the transistor on resistance of about 10Ω is close to the on-resistance of 100Ω of the prior art device so that the amplitude on the transmission bus 100 is approximately the same magnitude as that of the prior art.

For example, assume that the impedance and the termination resistor of the transmission line 100 are 50Ω, the impedance of the branched line is 100Ω, the terminating power supply feeds a voltage of 1.5 V, and the power supply for the driving circuit feeds a voltage of 3 V. With these assumptions, the signal amplitude becomes 0.6 V on the transmission line used in the foregoing paper indicating the use of the transistor with the on-resistance of 100Ω, and the amplitude is substantially equal to the amplitude of 0.68 V of the transmission line 100 shown in FIG. 4.

By lowering the on-resistance of the driving circuit 21 from 100Ω to 10Ω, it is possible to reduce the power consumed in the driving circuit. For example, in the above condition, the prior art device arranged to use an on-resistance of 100Ω consumes a power of 14.4 mW, while the present invention may greatly reduce the power consumption down to 1.9 mW. Moreover, the present embodiment may use a driving circuit having an on-resistance of 10Ω or more, concretely, about 50Ω. Such a driving circuit may offer the same effect as above.

Figure 6:
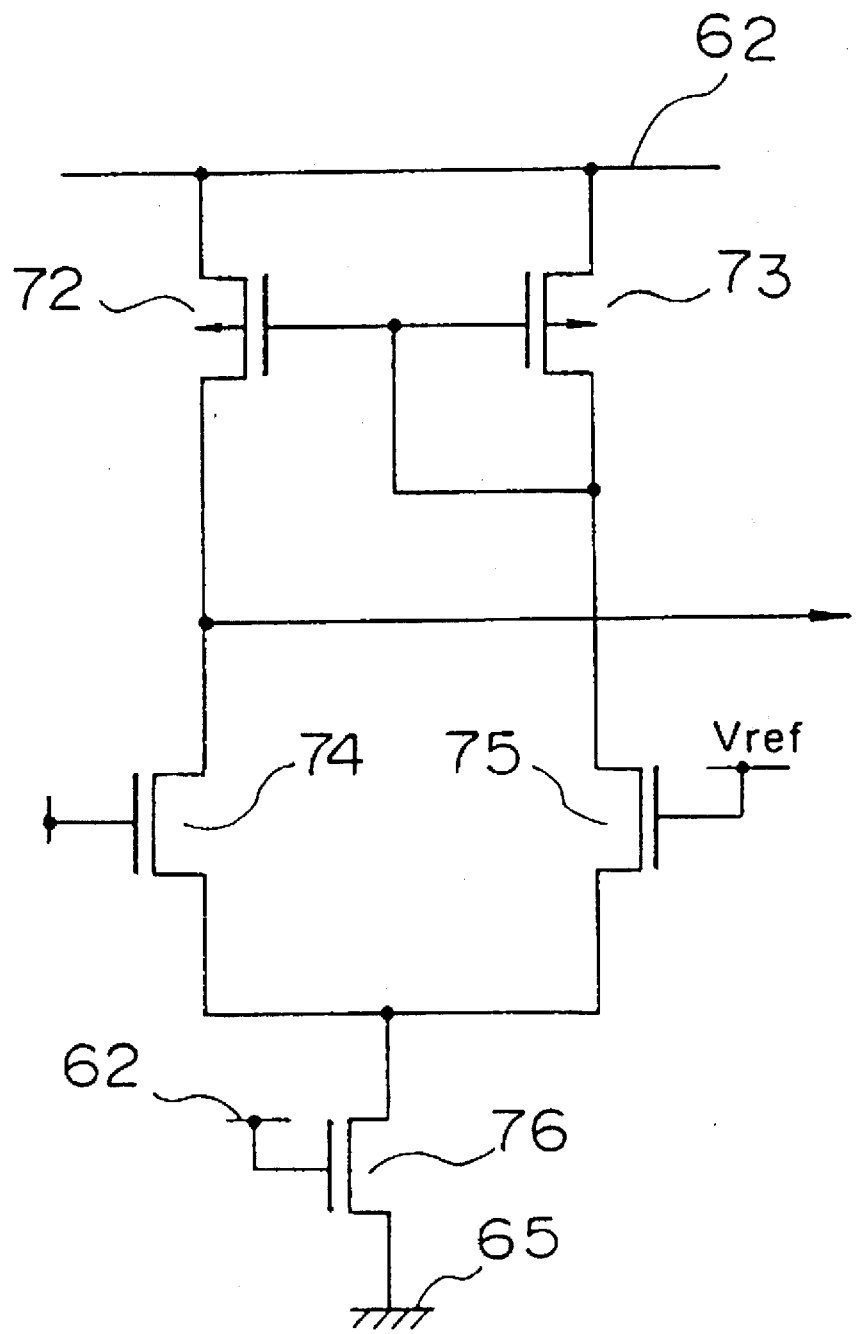
FIG. 6 is a circuit diagram showing an example of a differential receiving circuit.

Next, an example of the receiving circuits of FIG. 4 is shown in FIG. 6. This receiving circuit is a differential receiving circuit for determining if an input signal is logically High or Low based on whether or not an input voltage is higher or lower than the reference voltage Vref. The reference voltage used herein may be produced inside of an integrated circuit. However, if noises appearing inside of the integrated circuit or noises which have entered from the outside cause the power supply to fluctuate, the reference voltage may fluctuate accordingly. Hence, it is better to feed the reference voltage form the outside. Further, it is preferable that the receiving circuit is an NMOS type differential receiving circuit for receiving an input signal through the effect of the NMOS. If this type receiving circuit is used as the reference voltage, the voltage of the terminating power supply is used. In this case, the reference voltage is equal to half of a supply voltage. Hence, it is possible to receive a small amplitude waveform of 1 V or less around the reference voltage.

For example, under the following condition, the amplitude at receiving circuit is 0.68 V. Specifically, if each of the resistances of terminating resistors 50, 51 is 50 ohms, each of the resistances of matching resistors 80, 81, 82 and 83 is 75 ohms and the on-resistance of driving circuit is 10 ohms, the supply voltage for the driving circuit is 3 V, and the terminating supply voltage is 1.5 V, when the driving circuit is at a low output, the voltage at each receiving circuit is 1.16 V (=1.5 V−(1.5 V−0)×(50Ω/2)/(50/2+75Ω+10)=1.5−0.34) and when the driving circuit is at a high output, the voltage at each receiving circuit is 1.84 V (=1.5 V+(3−1.5)×(50/2)/(50/2+75+10)=1.5+0.34). Thus, the amplitude at each receiving circuit is 0.68 V (=1.84−1.16).

In FIG. 4, just one receiving circuit 32 to 34 of each circuit block is described by way of example. However, the present invention is not limited by the number of the receiving circuits.

In the signal transmission circuit arranged as described above, the resistance of each of the resistors 80 to 83 is made equal to a value derived by subtracting a half of an impedance of the line 100 from an impedance of the intra-block transmission line 11. The virtual impedance of the line 100 as viewed from the transmission line 11 is required to be halved, because the signal from the driving circuit block is branched into two ways at a contact point B with the bus 100. That is, the following expression is established:

$$Rm = Zs - Z0/2 \quad (1)$$

where Zs denotes an impedance of the transmission line 11, Z0 denotes an impedance of the line 100, and Rm denotes a resistance of the resistor 80.

As is understood from this expression, the total impedance of the resistor 80 and the line 100 as viewed from the transmission line 11 is made equal to the impedance of the transmission line 11 itself. This makes it possible to prevent repetitive reflections inside of a branched line.

The resistors 81 to 83 may be defined by the similar method. As such, another block may have the same effect as the foregoing block 1.

Next, to describe the effect of the resistor derived by the expression (1), the kind of waveform which is transmitted to each point of FIG. 4 when the driving circuit 21 is switched from a Low output to a High output will be discussed below with reference to the circuit diagram of FIG. 4.

First, it is necessary to derive a potential of the transmission line 100 occurring when the driving circuit 21 feeds a Low output. The voltage of the transmission bus is made equal to the voltage derived by dividing the terminating supply voltage of 1.5 V by a combined resistance (25Ω) of the termination resistors 50 and 51, the resistor 80 (75Ω) and the on-resistance (10Ω) of the driving circuit 21. Concretely, the voltage at the point B on the transmission line when the driving circuit 21 provides a Low output is as follows:

$$1.5\ V \times (75\Omega + 10\Omega)/(10\Omega + 75\Omega + 25\Omega) = 1.16\ (V)$$

In the circuit of FIG. 4, the signal driven from the driving circuit 21 is not reflected at the B point. Therefore, the overall signal is transmitted to the transmission line 100. The potential of the signal transmitted to the point B when the output of the driving circuit is switched from Low to High is equal to the voltage given by dividing the terminating supply voltage of 1.5 V and the supply voltage of 3 V of the driving circuit 21 by the terminating resistors 50 and 51, the resistor 80, and the on-resistance of the driving circuit 21. Hence, the signal potential at the B point when the driving circuit 21 provides a High output is derived as follows:

$$1.5\ V + (3\ V - 1.5\ V) \times 25\Omega/(10\Omega + 75\Omega + 25\Omega) = 1.84\ V$$

That is, the amplitude of the signal transmitted to the point B is;

$$1.84\ V - 1.16\ V = 0.68\ V$$

When the signal of the amplitude of 0.68 V transmitted to the transmission line 100 reaches the point C, though the transmission line of 100Ω is viewed through the resistor of 75Ω and the transmission line of 50Ω are viewed in the front, the mismatch of the impedance brings about reflection, because the total resistance of 38.9Ω of these two lines is different from the resistance of 50Ω of the transmission line through which the signal passes. The transmittance coefficient is: 1−the reflection coefficient=1−(50−38.9)/(50+38.9)=0.875. The potential of the signal passing through the point C is equal to the value derived by multiplying the signal amplitude of 0.68 V at the point B by the transmittance coefficient of 0.875 and adding an initial potential to the multiplied value. That is, the potential of the signal is:

$$0.68\ V \times 0.875 + 1.16\ V = 1.76\ V$$

Similar reflections take place at the point E or the point G. The potential at the E or the G point are 1.68 V and 1.61 V, respectively.

Figure 7A:
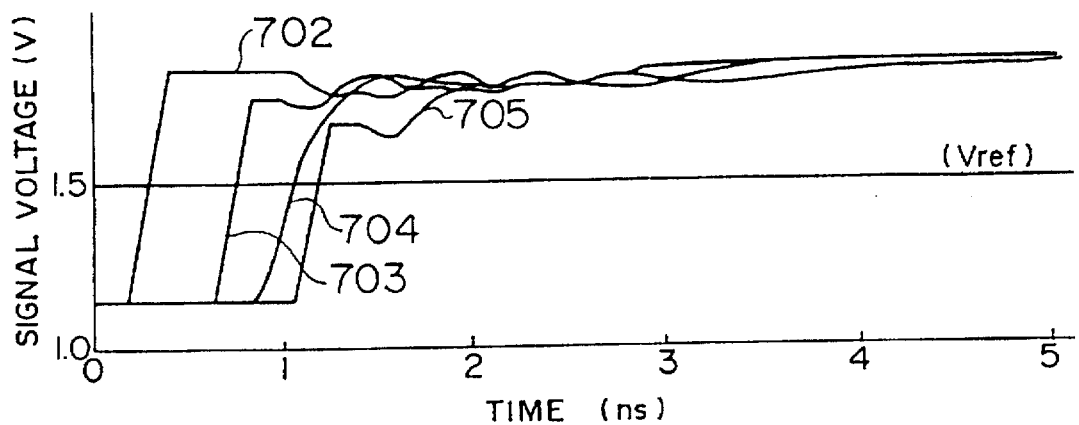
FIGS. 7A to 7C are graphs showing signal waveforms (leading waveforms) in the embodiment 1 of the present invention.
Figure 7B:
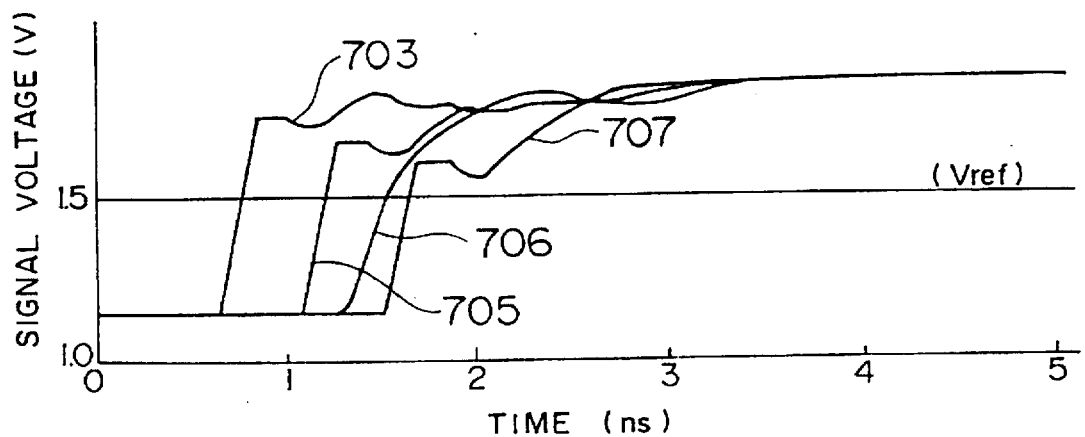
Figure 7C:
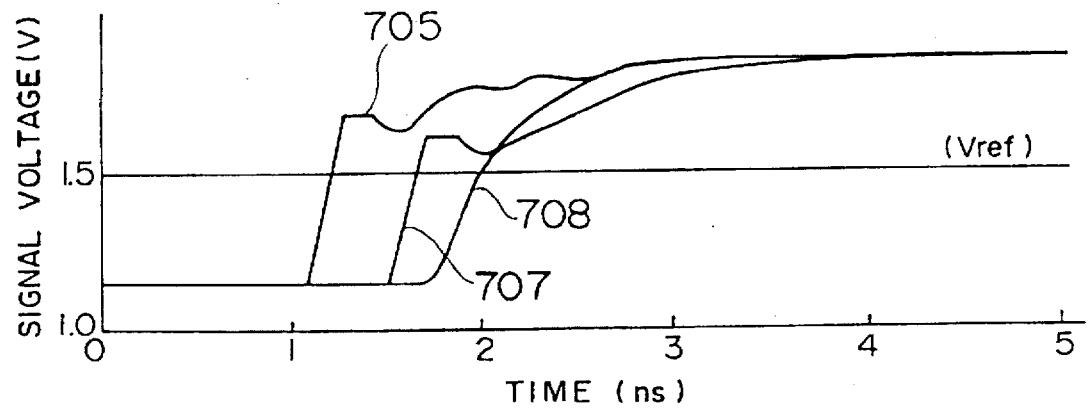
Figure 8A:
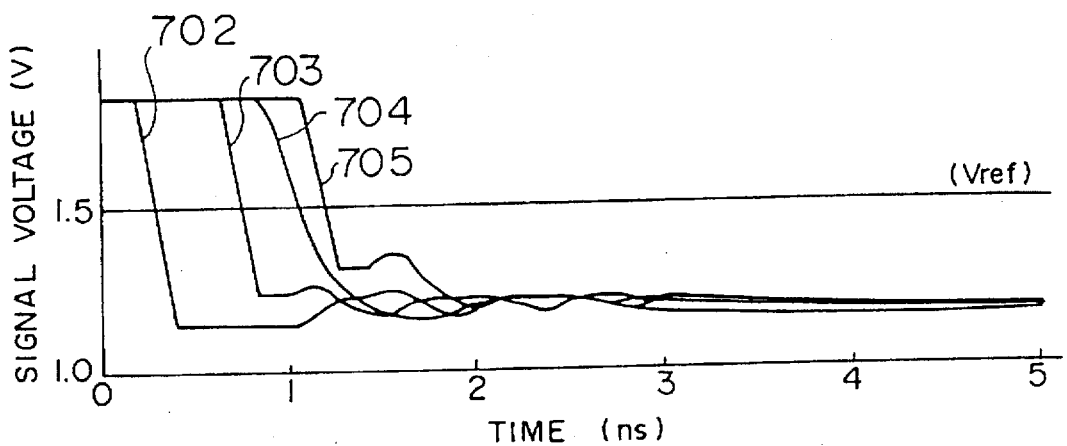
FIGS. 8A to 8C are graphs showing signal waveforms (tailing waveforms) in the embodiment 1 of the present invention.
Figure 8B:
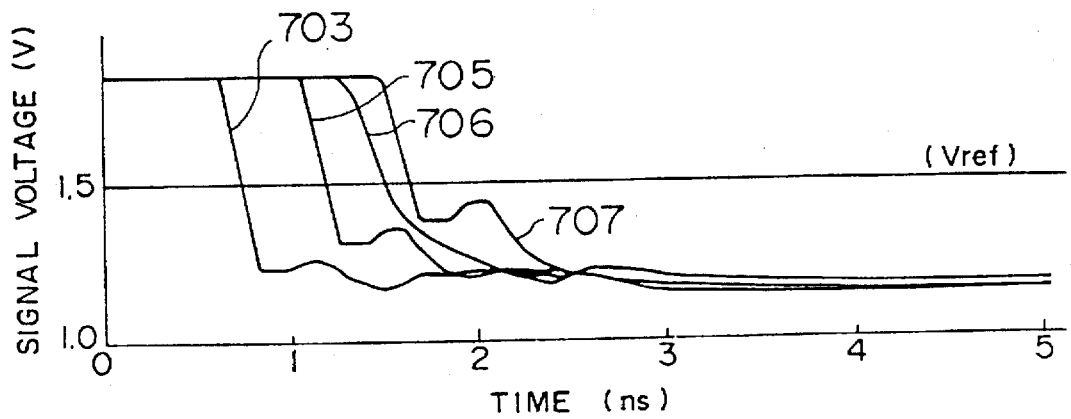
Figure 8C:
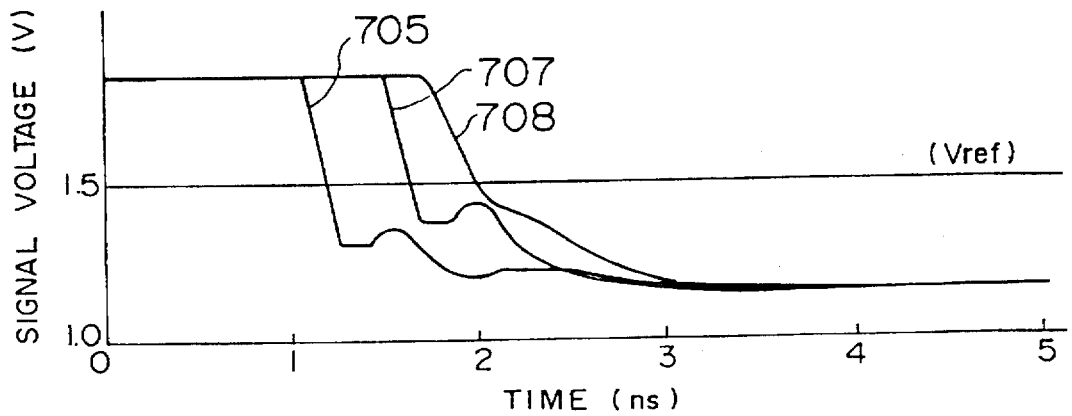
Figure 9A:
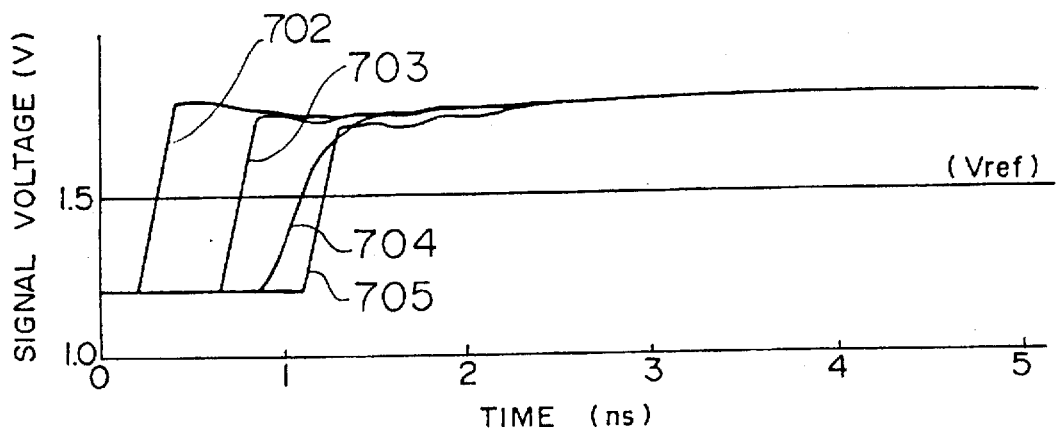
FIGS. 9A to 9C are graphs showing signal waveforms (leading waveforms) occurring in the case of changing an impedance of a transmission line in the circuit according to the embodiment 1 of the present invention.
Figure 9B:
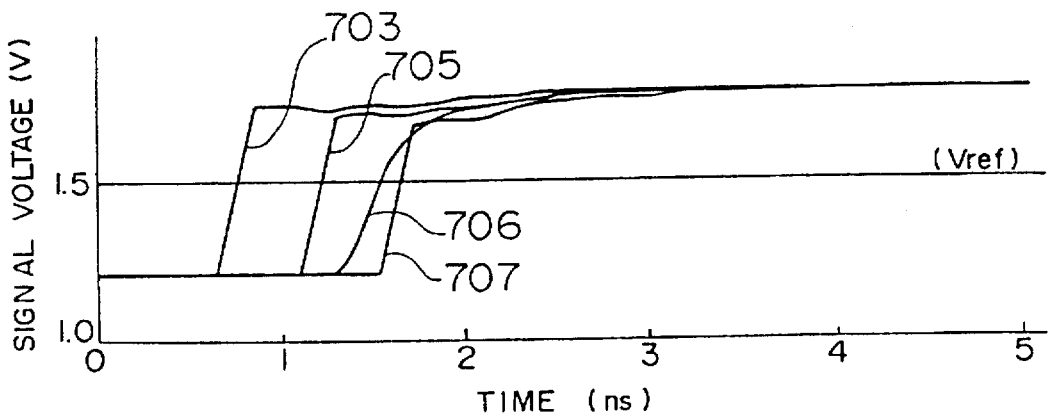
Figure 9C:
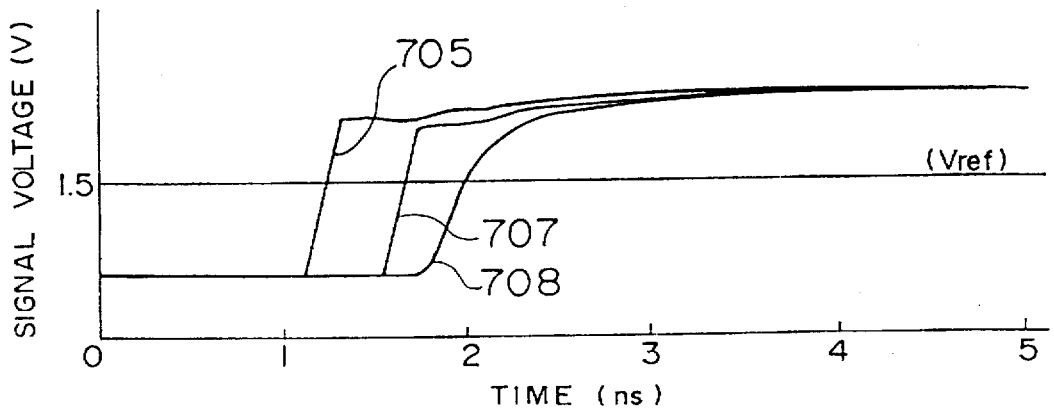
Figure 10A:
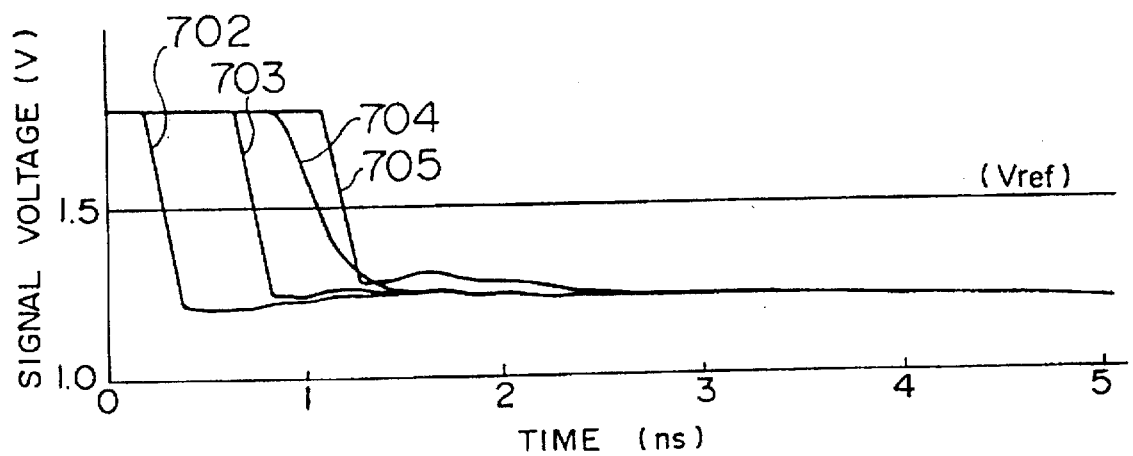
FIGS. 10A to 10C are graphs showing signal waveforms (tailing waveforms) occurring in the case of changing an impedance of a transmission line in the circuit according to the embodiment 1 of the present invention.
Figure 10B:
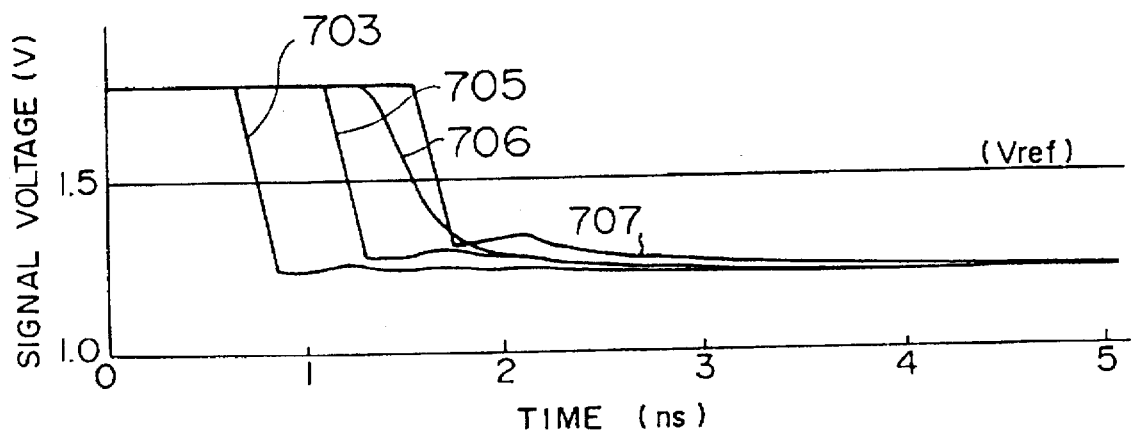
Figure 10C:
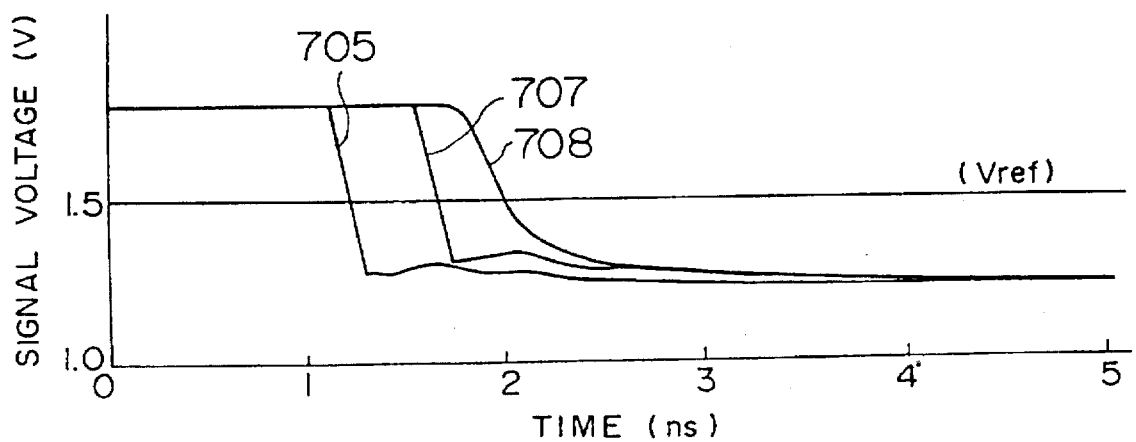

These results are shown in FIGS. 7A to 7C. FIG. 7A shows signal waveforms which come to and go out of the point C, that is, the signal waveform at the point B which comes to the point C and the signal waveforms at the points D and E which go out of the point C. Likewise, FIG. 7B shows signal waveforms which come to and go out of the point E. FIG. 7C shows signal waveforms which come to and go out of the point G. In FIGS. 7A–7C, a numeral 702 denotes a signal waveform at the point B in FIG. 4. A numeral 703 denotes a signal waveform at the point C. A numeral 704 denotes a signal waveform at the point D. A numeral 705 denotes a signal waveform at the point E. A numeral 706 denotes a signal waveform at the point F. A numeral 707 denotes a signal waveform at the point G. A numeral 708 denotes a signal waveform at the point H. When the signal drops, the same thing occurs. The signal waveforms at this time are shown in FIGS. 8A to 8C. In FIGS. 8A to 8C, numerals 702 to 708 denote the signal waveforms from the point B to the point H as in FIG. 4.

In the case of using the signal transmitting circuit clearly described in this embodiment, it is understood that it is possible for any first signal indicating a High level from the driving circuit 21 at each branch point to exceed the reference voltage (1.5 V in the above condition). Therefore, each receiving circuit will be able to recognize the High level being sent.

Such an effect of this invention is sufficiently brought about by the resistance for resistors 80 to 83 derived by the expression (1) as well as any value close to the resistance derived by the expression (1).

Figure 33:
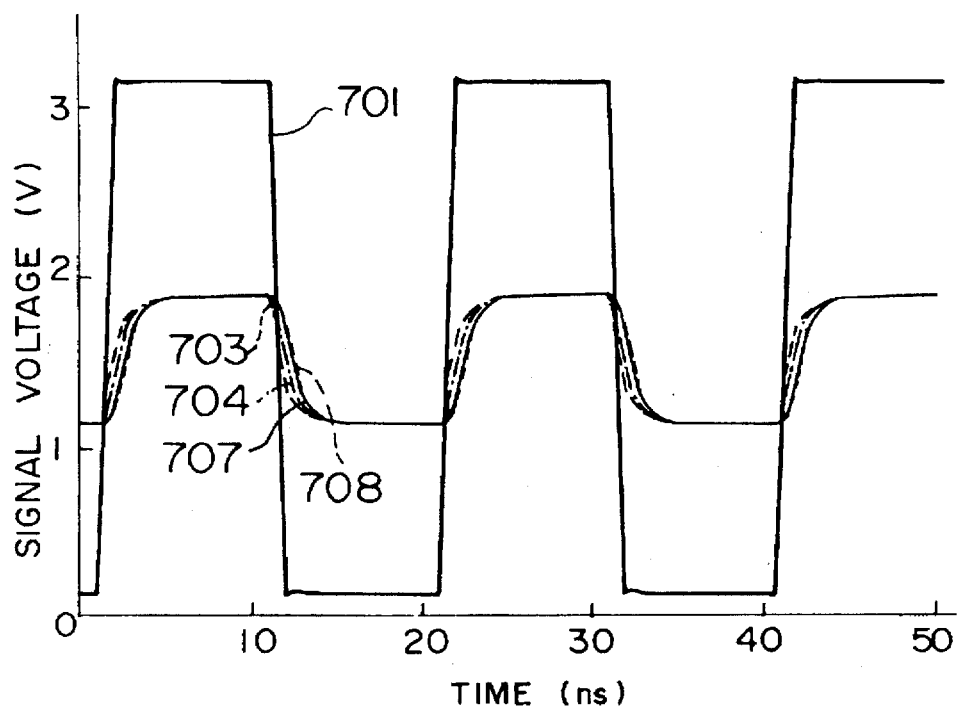
FIG. 33 shows signal waveforms in the circuit arrangement shown in FIG. 4.

This will be described with reference to FIGS. 33 to 35. FIG. 33 shows the waveforms at the points A, C, D, G and H in FIG. 4 through the relation between a time and a voltage as the sending circuit 21 continues to output a pulse waveform in the circuit arrangement shown in FIG. 4 in which the inter-block transmission line (main transmission line) 100 has a resistance of 50Ω, each of the intra-block transmission lines 11 to 14 has a resistance of 100Ω, each of the terminating resistors 50 and 51 has a resistance of 50Ω, the terminating supply voltage is 1.65 V and each of the resistors 80 to 83 has a resistance of 75Ω obtained by the expression (1).

In FIG. 33, a numeral 701 denotes a signal waveform at the point A. A numeral 703 denotes a signal waveform at the point C. A numeral 704 denotes a signal waveform at the point D. A numeral 707 denotes a signal waveform at the point G. A numeral 708 denotes a signal waveform at the point H. It is difficult to visually separate the curve indicated by 707 from the curve indicated by 708, because both of the curves are overlapped with each other.

Figure 34:
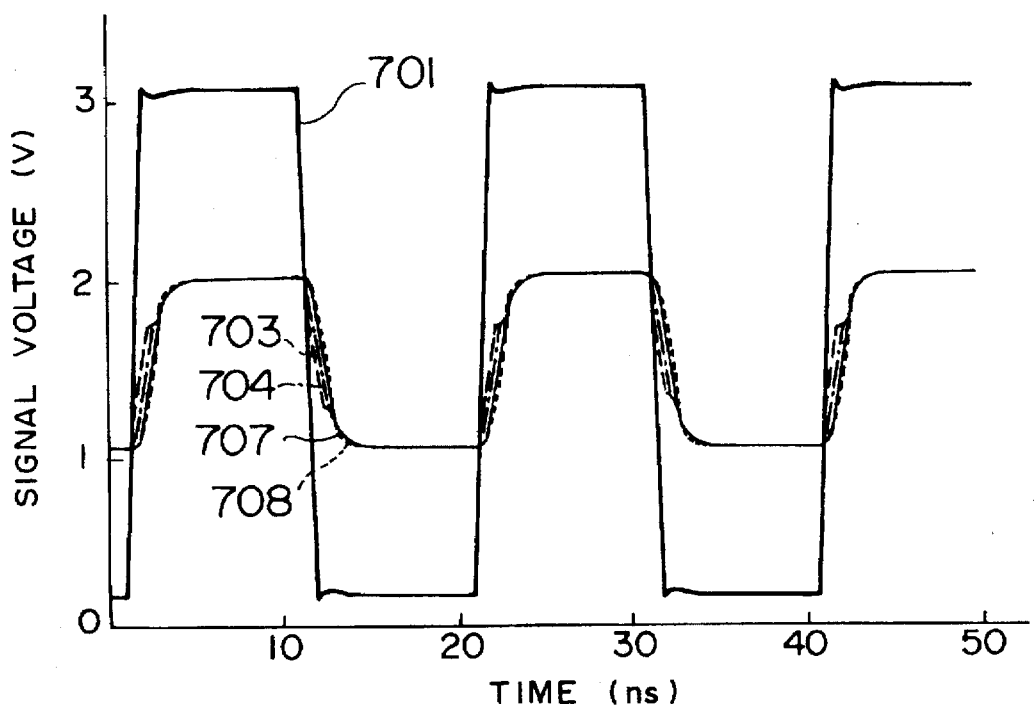
FIG. 34 shows signal waveforms in the circuit arrangement shown in FIG. 4 in the case where values of resistors 80 to 83 are made small.
Figure 35:
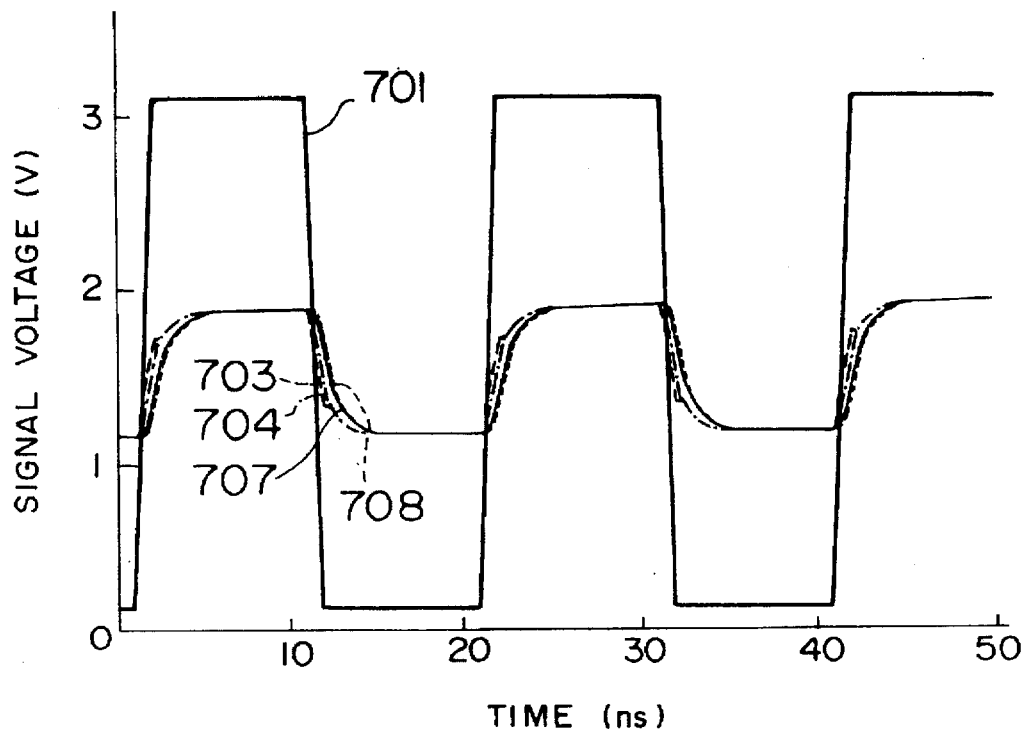
FIG. 35 shows signal waveforms in the circuit arrangement shown in FIG. 4 in the case where values of resistors 80 to 83 are made large.

On the contrary, FIG. 34 shows a waveform when each resistance of the resistors 80 to 83 is changed from 75Ω to 50Ω for obtaining a larger amplitude. As in FIG. 34, numerals 701, 703, 704, 707 and 708 show the waveforms at the points A, C, D, G and H as in FIG. 4, respectively. The resistance 50Ω used herein is only 66% of the resistance of 75Ω obtained by the expression (1). As can be seen from FIG. 34, such resistance values may be used without any trouble.

If the impedance of the intra-block line is 75Ω, each resistance of the resistors 80 to 83 may be fixed to 75Ω for keeping the signal amplitude the same as the value of FIG. 33. The waveform for this case is shown in FIG. 35. In this case, each resistance of the resistors 80 83 is larger than the resistance of 50Ω obtained by the expression (1) by a factor of 50%. With regard to this, it should be noted if each resistance of the resistors 80 to 83 is shifted to and fro by about 50% relative to the value obtained by the expression (1), the effect of the present application can still be achieved.

Further, to enhance the effect of the invention, it is preferable to set the resistances of the resistors 80 to 83 to be a higher value than the impedance of the main transmission line 100.

Each signal which enters into the transmission lines 12 to 14 at the points C, E and G is mirror-reflected on the corresponding receiving circuit and then returns to the branch point. Since this circuit keeps the impedances properly matched, the overall signal is transmitted to the transmission line 100 at one time without reflection of the signal on the branch point.

As is obvious from this figure, the resistors inserted in the present invention make it possible to greatly reduce the potential drop resulting from the reflection. Further, these resistors make the signal potential drop in a remote receiving circuit from the driving circuit negligible.

By inserting a resistor having a predetermined resistance around a contact between the transmission line inside of the circuit block and the inter-block transmission line, it is possible to keep the signal amplitude on the transmission bus smaller and transmit the signal at high speed.

When a resistance of each of the matching resistors 80 to 84 is Rm, a resistance of each of the terminating resistors 50 and 51 is Rt, and an amplitude of the signal produced by the driving circuit 21 is V0, the amplitude of the signal on the transmission line 100 is given by $$V=0.5 \times Rt \times (Rm+0.5 \times Rt) \times V0 \quad (2)$$

The matching impedance Rm is further expressed in accordance with the expression (1) by using the impedance Z0 of the transmission line 100 and the impedance Zs of the intra-block transmission lines 11 to 14 as follows:

$$Rm=Zs-Z0/2$$

Further, the resistance of the terminating resistor Rt is made equal to the impedance of the transmission line 100, that is, $$Rt=Z0$$

When these expressions are substituted for the corresponding resistors of the equation (2), it is understood that the signal amplitude on the transmission line 100 is given by $$V=0.5 \times (Z0/Zs) \times V0$$

This expression is transformed into $$V/V0=0.5 \times (Z0/Zs) \quad (3)$$

The ratio of the amplitude of the signal propagated on the transmission line 100 and the amplitude of the signal produced by the driving circuit 21 is equal to a half of the ratio of the impedance of the transmission line 100 and the impedance of the intra-block transmission lines 11 to 14. That is, if the impedance of the transmission line 100 is 50Ω, the impedance of the intra-block transmission lines 11 to 14 is 100Ω and the power supply voltage of the driving circuit 21 is 3 V, the signal amplitude on the transmission line 100 is given by $$0.5 \times (50\Omega/100\Omega) \times 3 \ V=0.75 \ (V)$$

This amplitude is different from the actual amplitude of 0.68 V because the on-resistance of the driving circuit is not considered in the expression (2).

As described above, how much the signal amplitude is made smaller is allowed to be freely designed by changing the two impedances Z0 and Zs of the transmission line 100 and the intra-block transmission line.

For example, if the driving circuit 21 has an on-resistance of 10Ω, assuming that the intra-block transmission line has a resistance of 100Ω and the transmission line 100 has a resistance of 25Ω, the signal amplitude of the transmission bus is calculated as follows:

$$1.5 \ V \times 12.5\Omega/(12.5\Omega+87.5\Omega+10\Omega) \times 2=0.34 \ (V)$$

in which each of the resistors 80 to 83 has a resistance of 87.5Ω. The waveforms at this case are shown in FIGS. 9A to 9C and 10A to 10C. In these figures, numerals 702 to 708 denote the signal waveforms at the points B to H as in FIG. 4. From this figure, it is understood that a waveform with a smaller amplitude and a small drop is obtained.

In this example, since Z0=50Ω and Zs=75Ω, the signal amplitude of the transmission line 100 is equal to one eighth of the power supply voltage 3 V of the driving circuit in accordance with the expression (3) as calculated as follows:

$$0.5 \times (25/100)=0.125$$

Further, the resistors 80 to 83 have an effect of suppressing lowering of the impedance of the transmission line 100 resulting from the load capacitance in the circuit block. That is, by inserting a resistor between the transmission line 100 and each of the circuit blocks 1 to 5, the inter-block transmission line is not able to see the capacitance in the circuit block directly (i.e., the total of the transmission line load capacitance and the capacitance of the driving and receiving circuits). Hence, it is possible to suppress the lowering of the impedance of the transmission line.

In addition, only the value of the terminating resistor can be lowered to make small the amplitude so that the signal waveform having low attenuation can be obtained without changing the impedances of the intra-block transmission lines and the inter-block signal transmission line.

Figure 11:
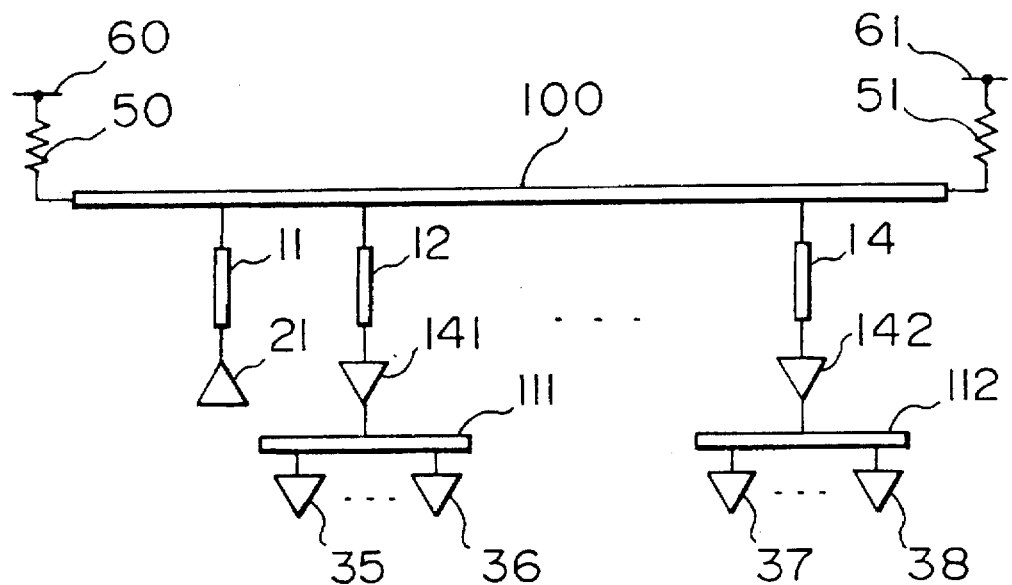
FIG. 11 is a diagram showing a unidirectional transmission line including a multi-stage receiving circuit.

Further, a receiving circuit unit sometimes includes receiving circuits connected to the output of the receiving circuit connected to the transmission line as shown in FIG. 11. For example, an address signal circuit of a memory module includes such receiving circuits. An address signal supplied to the memory module is once inputted to a driver circuit and then supplied from the driver circuit to an input circuit of a memory LSI in the memory module.

In addition to the address signal circuit, there is a circuit for transmitting and receiving a clock control signal, an RAS (Row Address Strobe) signal, a CAS (Column Address Strobe) signal, a CS (Chip Select) signal and an enable signal.

The memory module is a representative one of the units and a CPU module is enumerated as another unit including a receiving circuit and a driving circuit.

Termination of the transmission line 100 by the termination resistors 50 and 51 and connection of the resistors 80 and 81 to the intra-block transmission lines 11 to 14 in such a circuit can make the amplitude small in the interface on the transmission line 100, while since the power supply voltage of the output buffer circuit is 5 V or 3.3 V in the interface ahead of the butter circuit, the interface has as large an amplitude as TTL or LVTTL and the high-speed signal transmission is difficult. Accordingly, the signal transmission shown in the above example cannot be attained at a high speed since the transmission speed of a signal on transmission lines 111 to 112 is restricted.

Accordingly, it is necessary to further improve the signal transmission device including the receiving circuit unit shown in FIG. 11.

Figure 12:
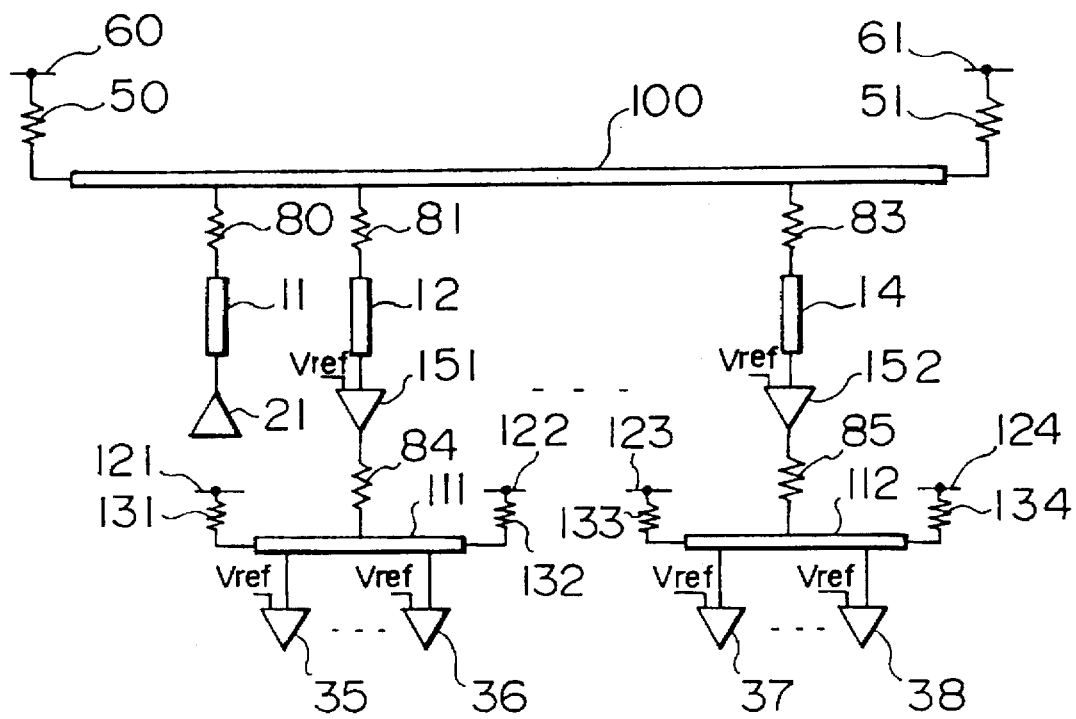
FIG. 12 is a diagram showing an embodiment in which the present invention is applied to the transmission line shown in FIG. 11.

FIG. 12 shows an example capable of transmitting a signal at a high speed in a multi-stage signal transmission device in which receiving circuits are further connected to the output of the receiving circuit connected to the transmission line 100.

In the circuit of FIG. 12, the features of the driving circuit 21, how to determine the resistances of the resistors 80 to 83 and how to transmit a signal from the driving circuit 21 to circuits 151 and 152 are the same as those described with reference to the circuit of FIG. 4.

The following description will be directed to portions of FIG. 12 that are different from FIG. 4, that is, portions connected to the outputs of the circuits 151 and 152.

The circuits 151 and 152 have the function of the differential input circuit and the driving circuit. The differential input circuit is configured by the circuit shown in FIG. 6, for example, and the driving circuit is configured by the circuit shown in FIG. 5, for example.

An output of the circuit 151 is connected through a resistor 84 and a transmission line 111 to inputs of receiving circuits 35 and 36. An output of the circuit 152 is connected through a resistor 85 and a transmission line 112 to inputs of receiving circuit 37 and 38. Further, the transmission line 111 is terminated by termination resistors 131 and 132 and the transmission line 112 is also terminated by termination resistors 133 and 134.

FIG. 12 shows the arrangement having a plurality of receiving circuit units and a plurality of receiving circuits connected to the output of the receiving circuit connected to the transmission line 100, while the present invention is not limited to the number of these units and circuits.

By connecting the resistors 84 and 85 between the receiving circuits and also connecting the termination resistors, a voltage of a power supply used in driving circuits of the circuits 151 and 152 can be divided to reduce the signal amplitude on the transmission lines 111 to 112.

Further, by properly selecting the resistances of the inserted resistors 84 and 85 and the terminating resistors 131 to 134, the signal amplitude on the transmission lines 111 to 112 can be set to the value equal to or close to the signal amplitude on the transmission line 100, so that the same interfaces can be used in both of the transmission line 100 and the transmission lines 111 to 112.

The signal amplitude substantially equal to that on the transmission line 100 is set to be outputted on the transmission lines 111 to 112. That is, when the resistance of the resistors 80 to 83 is Rm, the resistance of the resistors 50 and 51 is Rt, the resistance of the resistor 84 is Rm', and the resistance of the resistors 131 to 134 is Rt', the signal amplitude on the transmission line 100 is given by $$0.5 \times Rt \times (Rm + 0.5 \times Rt) \times V0$$

where V0 is an amplitude of the signal produced by the driving circuit 21.

Further, the signal amplitude on the transmission lines 111 to 112 is given by $$0.5 \times Rt' \times (Rm' + 0.5 \times Rt) \times V0'$$

where V0' is an amplitude of the signal produced by the output circuits 151 and 152.

When the resistances of the resistors Rm, Rt, Rm' and Rt' are set so that the above-mentioned two signal amplitudes are substantially equal to or close to each other, the same interfaces can be used in any of the transmission lines 100 and 111 to 112.

For example, when the on-resistances of the driving circuits in the circuits 151, 152 are set to the same resistance of 10Ω as the on-resistance of the driving circuit 21, the resistances of the resistors 84 to 85 and the resistors 80 to 83 are set to the same resistance of 75Ω, and the resistances of the terminating resistors 131 to 134 are set to the same resistance of 50Ω as the terminating resistors 50 to 51, the signal amplitude on the transmission lines 111 to 112 becomes 0.68 V, which is the same as the signal amplitude on the transmission line 100.

As described above, according to the present invention, the signal amplitude can be made small on all buses in the signal transmission circuit and the same interfaces using the same circuit can be configured by setting the resistors. The present invention can be used in a processor bus, a memory bus, a system bus, an I/O bus and the like in a computer used in a work station, a personal computer and the like, so that a fast computer system can be configured.

Referring now to FIGS. 13 to 29, modifications of definite examples of the receiving circuit unit and the transmitting circuit unit of FIG. 4 or 12 are described.

Figure 13:
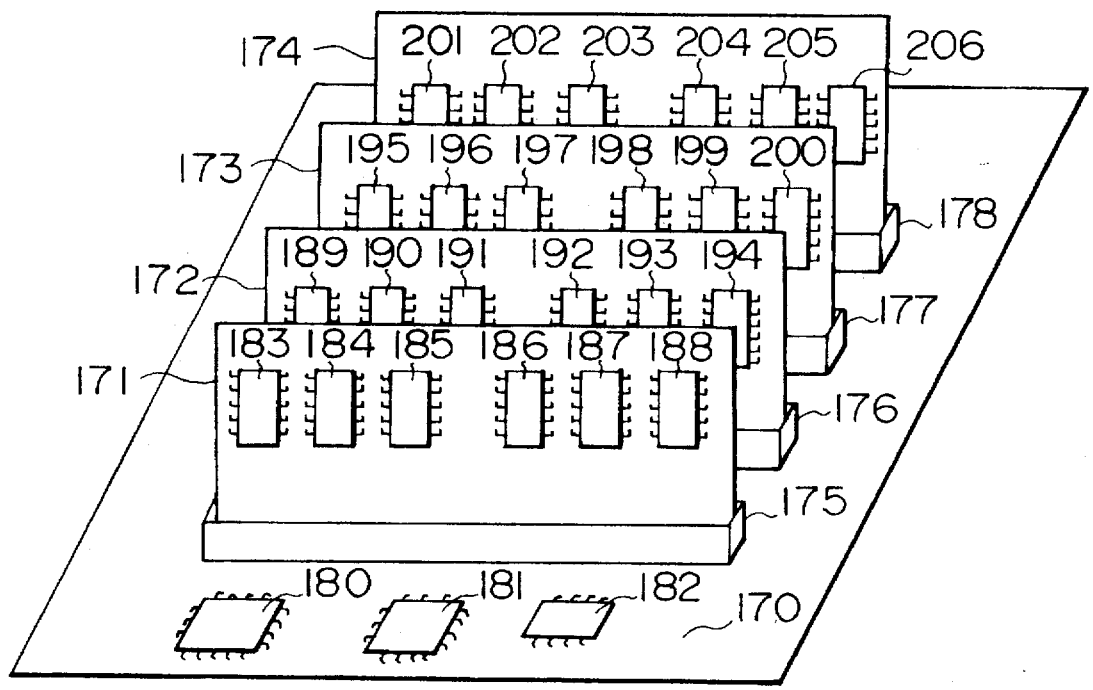
FIG. 13 shows modules mounted on a main board.

First of all, before description of the modifications, how the circuit units are mounted in a definite device is described with reference to FIG. 13 showing an example of a device including the circuit of FIG. 4 or 12.

The device shown in FIG. 13 includes a main board 170 and modules 171 to 174 mounted on the main board. The modules 171 to 174 are connected to each other through the main board 170.

In FIG. 13, four modules are mounted by way of example, while in the present invention the number of modules is not limited to four. Further, in FIG. 13, the modules are mounted by means of connectors 175 to 178, while it is a matter of course that the present invention is not limited to use of the connectors and is not also limited to the number of components 180 to 192 on the main board and the number of components 183 to 206 on the modules.

In the device shown in FIG. 13, the modules 171 to 174 correspond to the receiving circuit unit or the transmitting circuit unit of FIG. 4 or 12 and the inter-unit signal transmission line connecting between these circuit units is not shown but is mounted on the main board.

Definite examples of the modules are now described.

Figure 14:
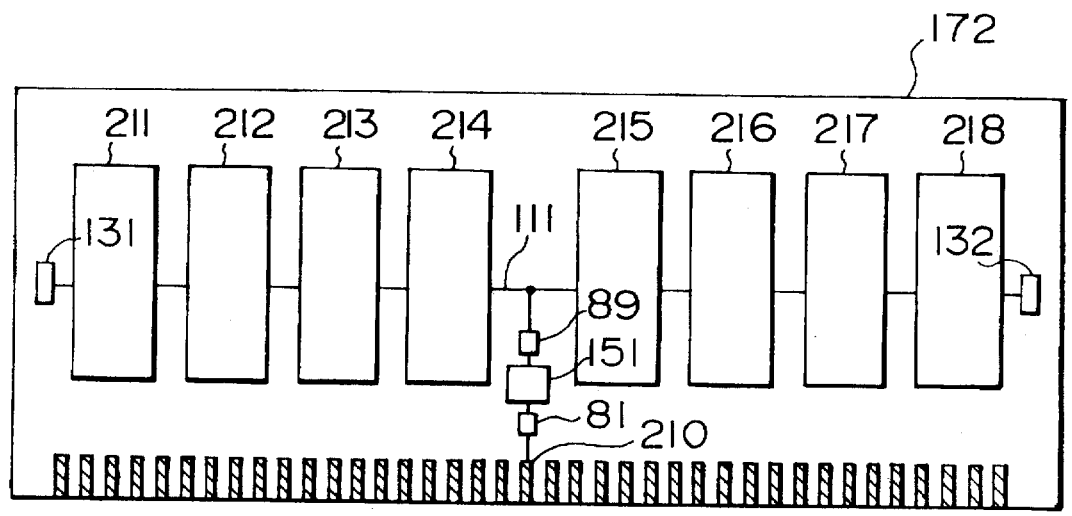
FIG. 14 shows the module in detail.
Figure 15:
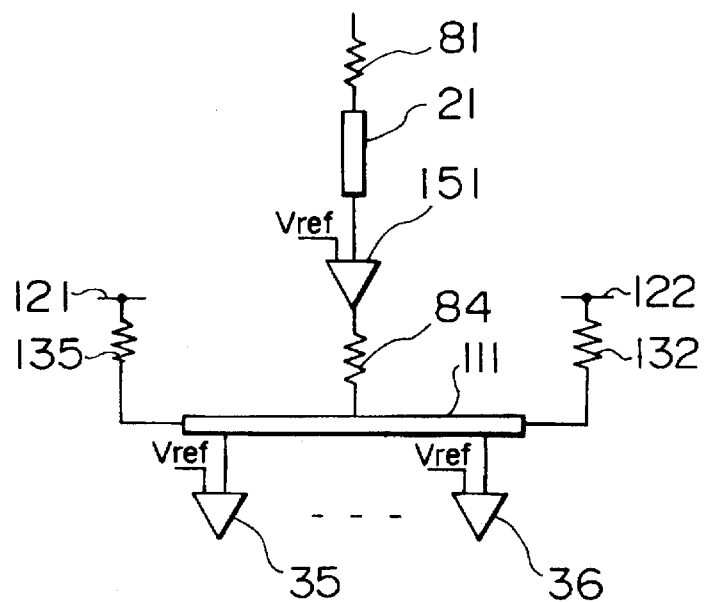
FIG. 15 is an equivalent circuit diagram of the module shown in FIG. 14.

A module shown in FIG. 14 is a definite example of a receiving circuit unit shown in FIG. 15. The module includes a contact portion 210 for driving and receiving signals to and from other boards. A signal received through the contact portion 210 is sent through a resistor 81, a circuit 151 and a resistor 84 to circuit elements 211 to 218. A wiring for propagating the signal from the resistor 84 to the circuit elements is terminated at both ends thereof.

Figure 16:
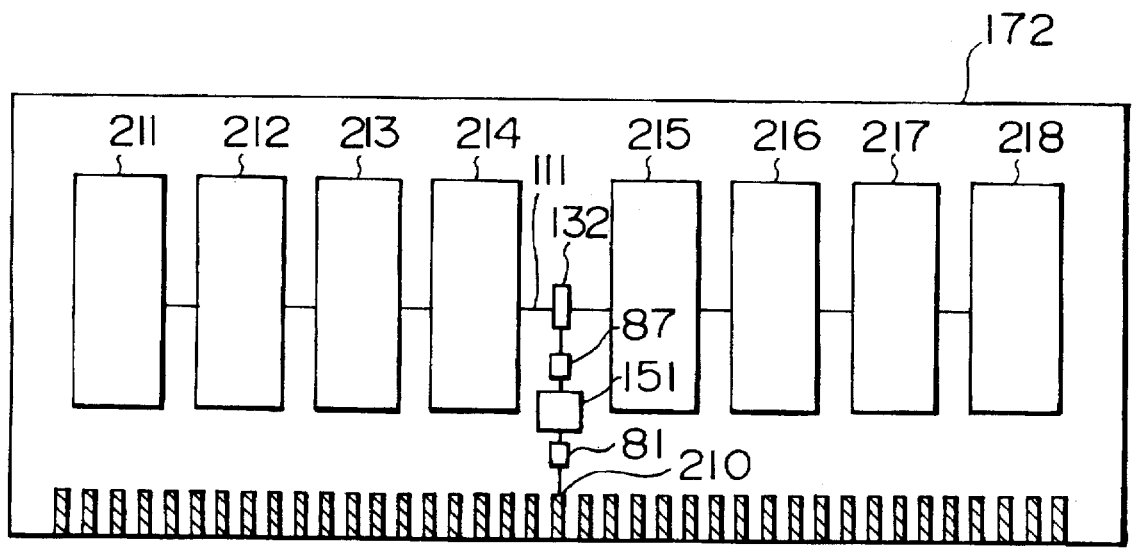
FIGS. 16, 18, 20, 22, 24, 26, 28, 29, 30, 31 and 32 show modified modules, respectively.
Figure 17:
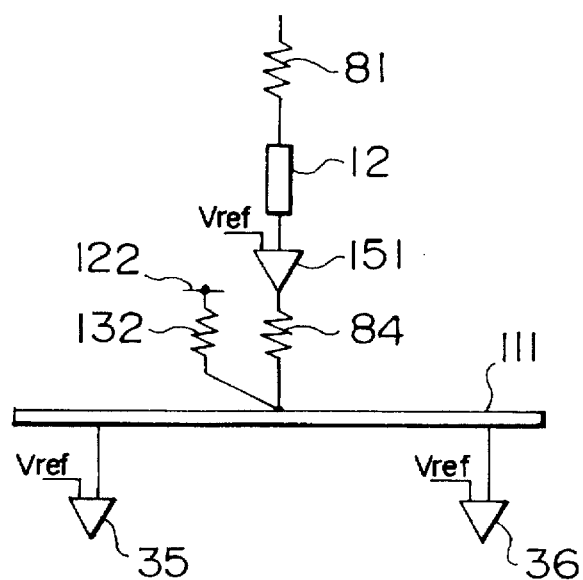
FIGS. 17, 19, 21, 23, 25 and 27 are equivalent circuit diagrams of the modified modules, respectively.

FIG. 16 shows a definite example in which the termination at both ends of FIG. 14 is substituted by the termination at a transmitting end to reduce two termination resistors to one termination resistor. In this case, since the number of the termination resistors is reduced to a half, that is, from two to one, the resistance of the termination resistor may be reduced to a half as compared with that of FIG. 14 in order to make the signal amplitude on the transmission line 111 equal to that on the transmission line 100.

The arrangement shown in FIG. 14 may suppress the reflection of a signal by the far-end termination and is the most preferable arrangement for the high-speed transmission of a signal. The arrangement of FIG. 14 is featured in that resistors are apt to be arranged as compared with the arrangement shown in FIG. 16.

The arrangement shown in FIG. 16 is terminated at the sending (near) end and hence is the arrangement in which a signal is reflected at the far end and the reflected signal is suppressed at the near end. In this arrangement, it takes time (about two times) to suppress the reflected signal as compared with the arrangement shown in FIG. 14 but the number of mounted components (terminating resistors) can be reduced.

Figure 18:
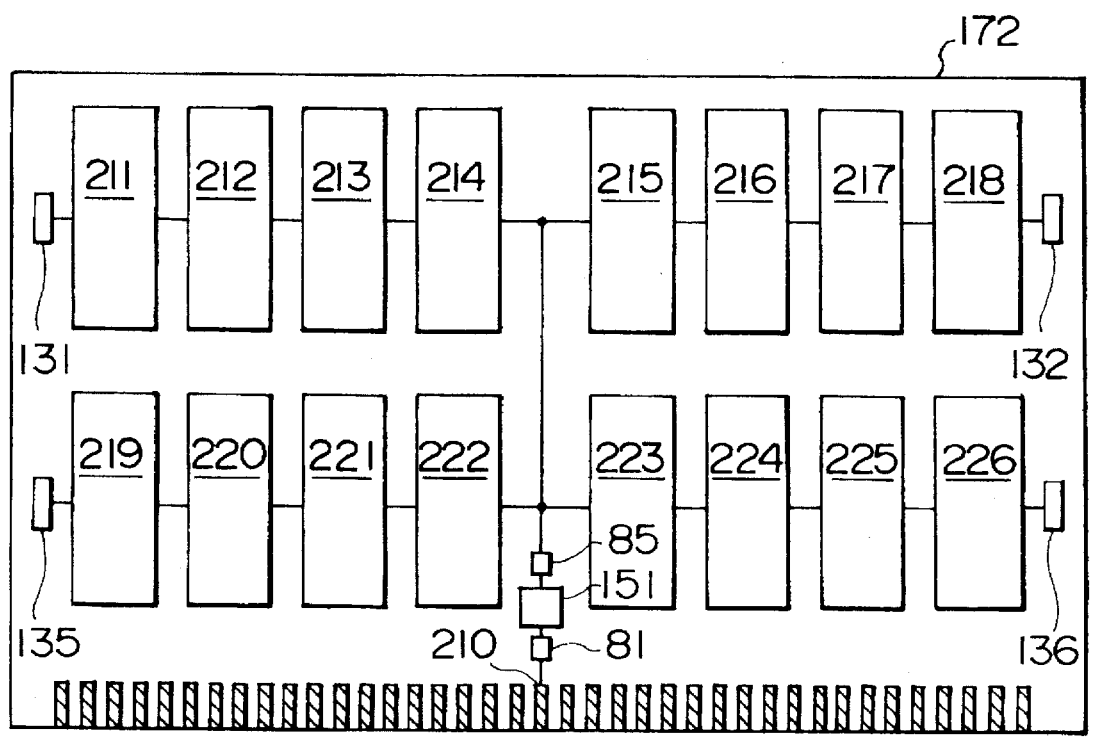
Figure 19:
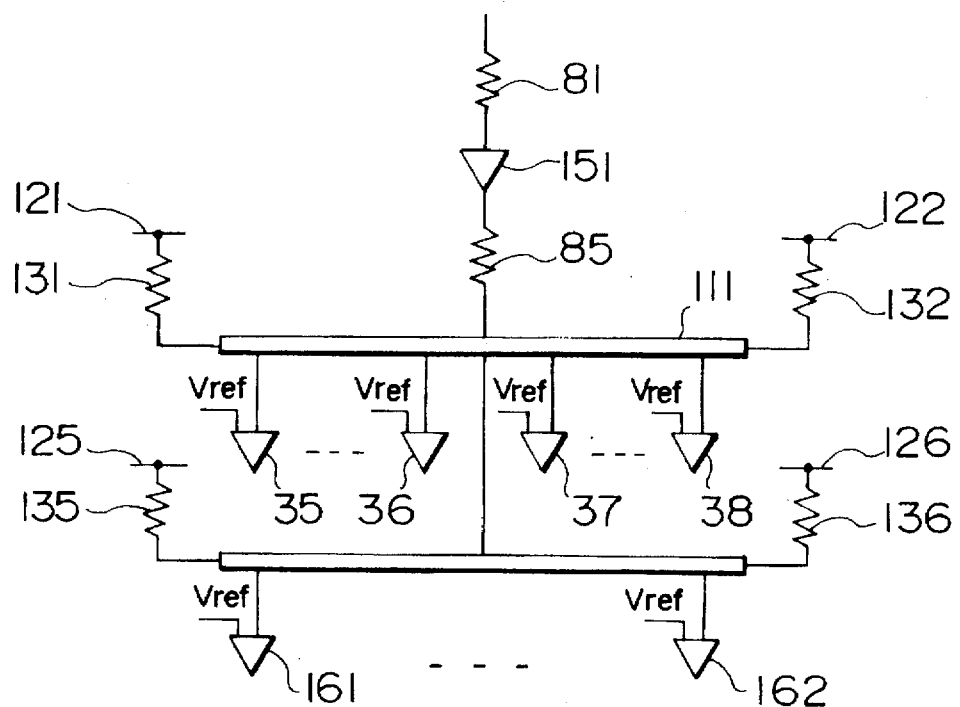
Figure 20:
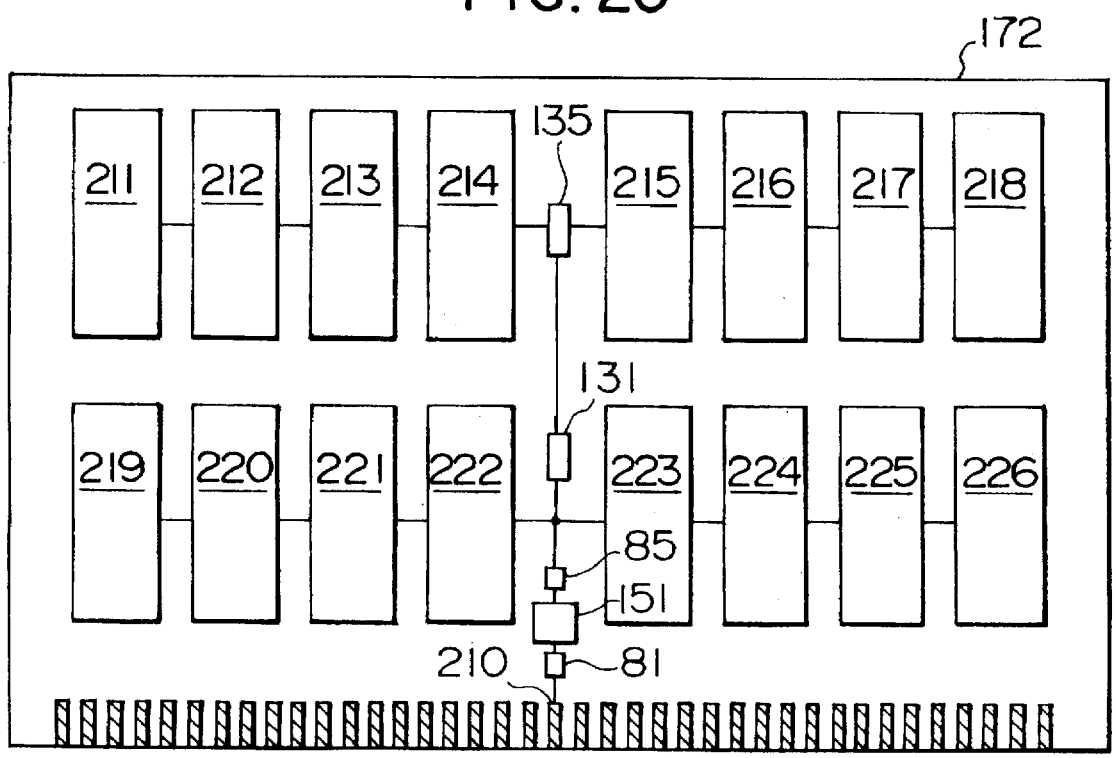
Figure 21:
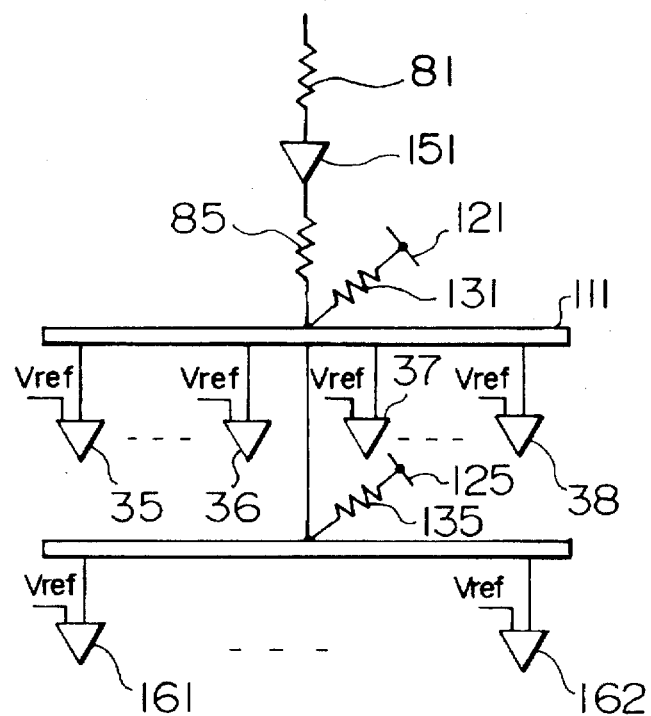

In FIGS. 14 and 16, the circuit elements 211 are arranged in a line on the module, while modules having the circuit elements arranged in a double line are shown in FIGS. 18 and 20. Equivalent circuits of the modules shown in FIGS. 18 and 20 are shown in FIGS. 19 and 21, respectively.

FIG. 18 shows an application example of the both-end termination type modules of FIG. 14 which are arranged in a double line. In this circuit configuration, since the number of the terminations is increased from two in FIG. 14 to four, the resistance of the termination resistors is required to be doubled as compared with the resistance in FIG. 14 in order to made the signal amplitude on the transmission line 111 equal to the signal amplitude on the transmission line 100.

Further, FIG. 20 shows an application example of the transmission-end termination type modules of FIG. 16 which are arranged in a double line. In this circuit configuration, the number of the terminations is two in the same manner as FIG. 14 and hence the resistance of the termination resistors is set to the same value as in FIG. 14.

In the arrangement of FIG. 18, a signal can be suppressed at the far end because of the far-end termination in the same manner as in FIG. 14 and resistors are apt to be arranged. The arrangement of FIG. 18 can shorten the time required to suppress the reflection of the signal extremely as compared with other arrangements.

The arrangement of FIG. 20 also attains the high-speed transmission as compared with other arrangements and since the relation of the arrangement of FIG. 20 to the arrangement of FIG. 18 is the same as the relation of the arrangement of FIG. 16 to that of FIG. 14, the time required to suppress the reflection of the signal in the arrangement of FIG. 20 is twice that of the arrangement of FIG. 18.

Figure 22:
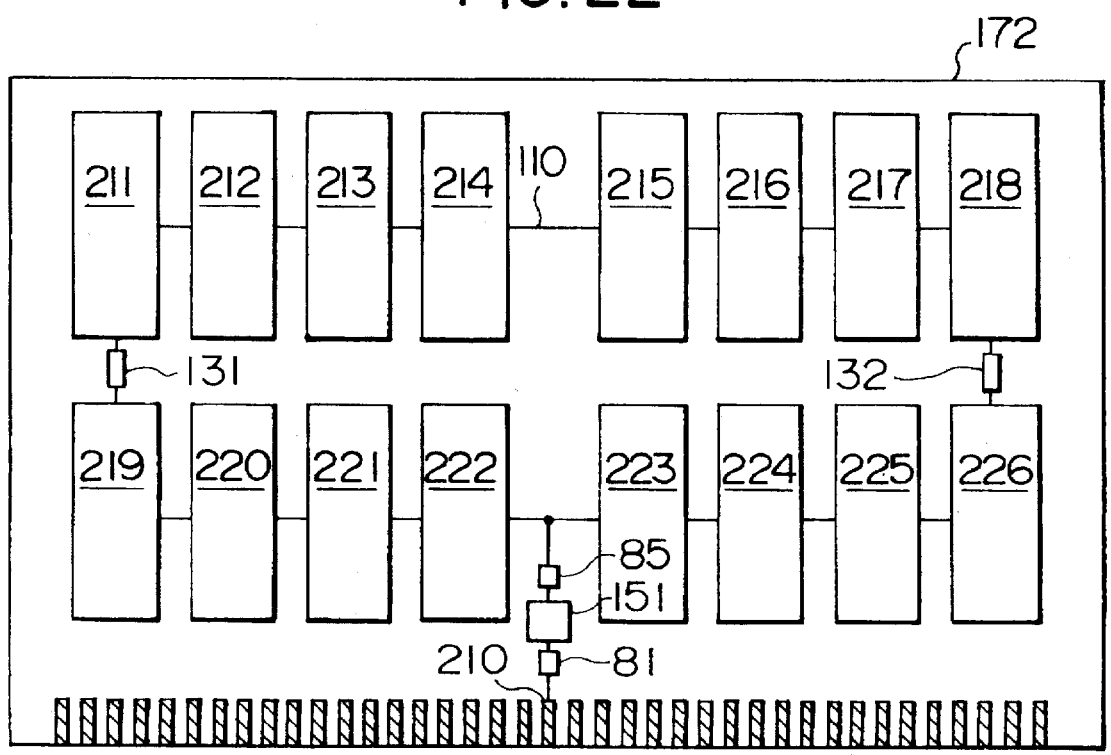
Figure 23:
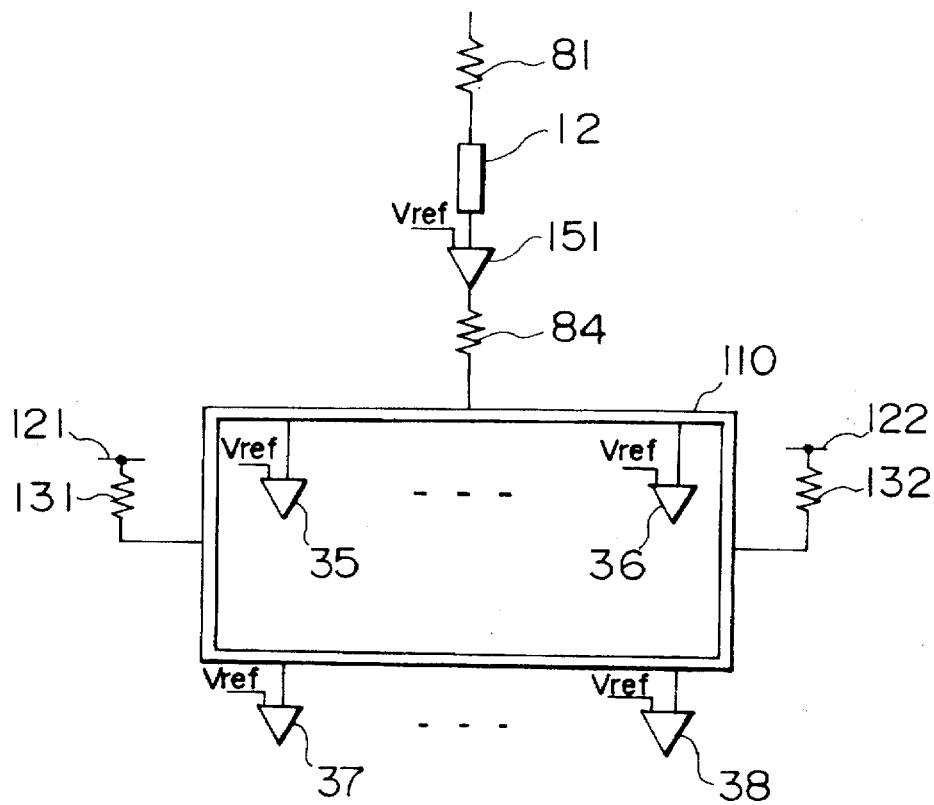
Figure 24:
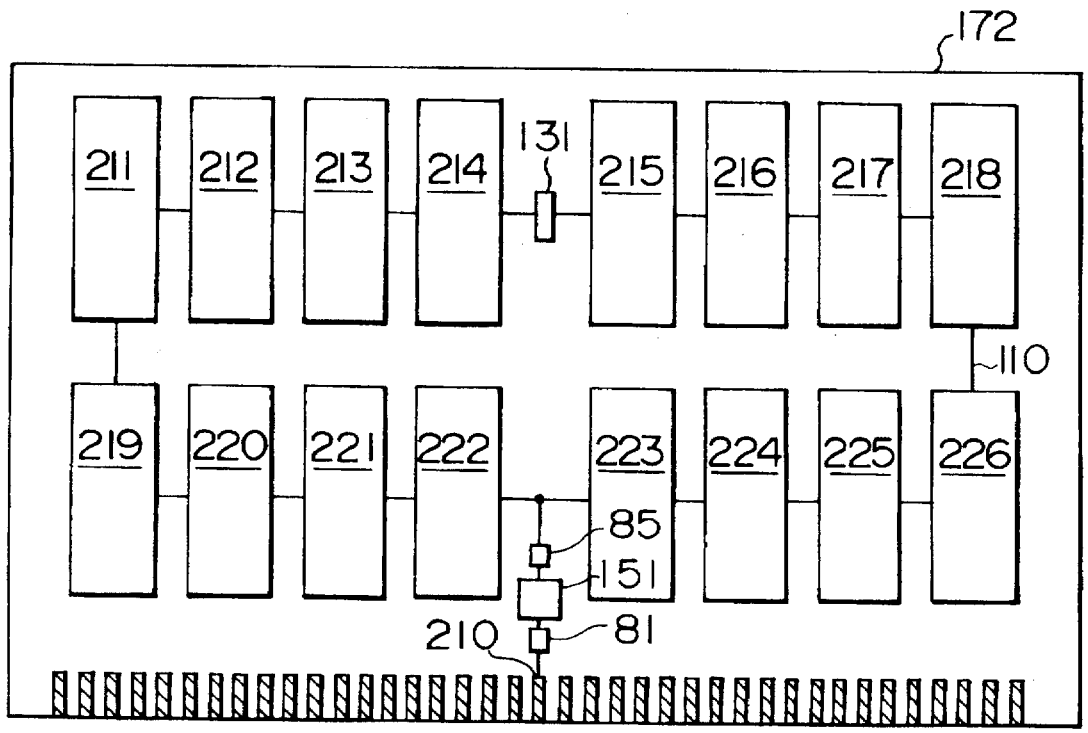
Figure 25:
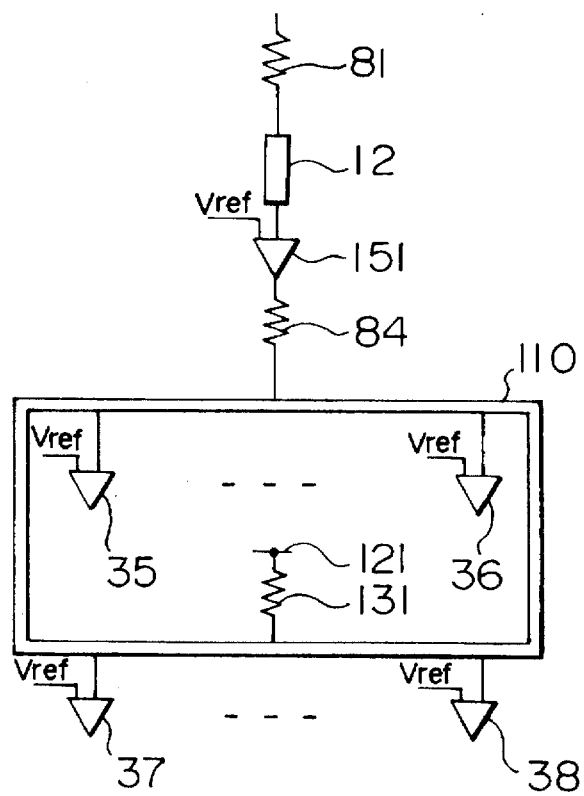
Figure 26:
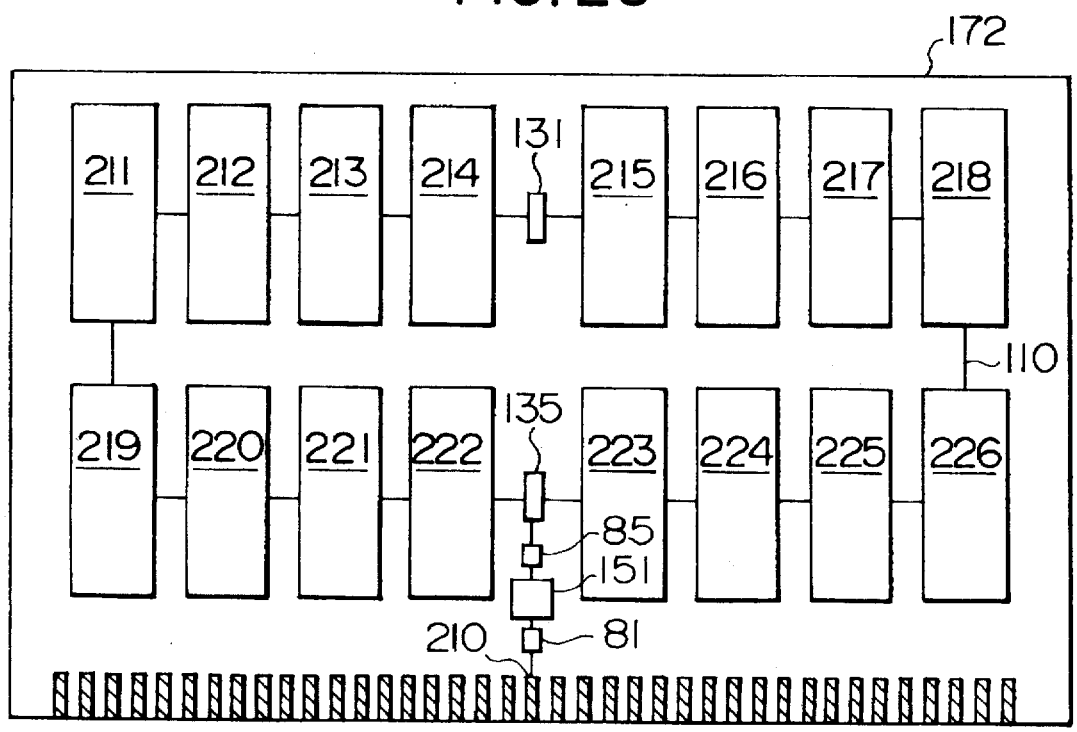
Figure 27:
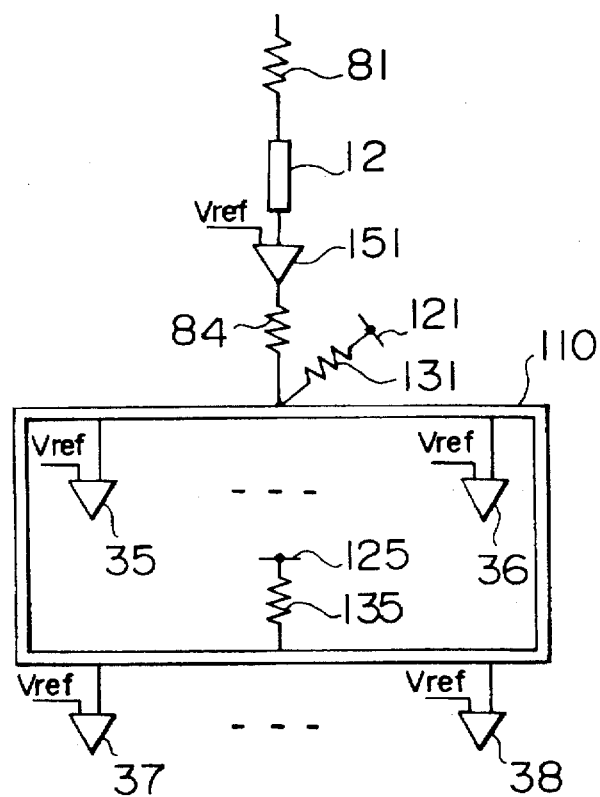

FIGS. 22, 24 and 26 show examples of the double-line arranged modules having the transmission line 111 arranged into a ring. FIGS. 23, 25 and 27 show equivalent circuits of the modules shown in FIGS. 22, 24 and 26, respectively. The modules shown in FIGS. 22, 24 and 26 are different from each other in the termination positions. The module shown in FIG. 22 is terminated at two positions between the far end and the transmitting end. The module shown in FIG. 24 is terminated at only one position of the far end. The module shown in FIG. 26 is terminated at the far end and the near end.

In these modules, the resistance of the termination resistors in the arrangement of FIGS. 22 and 26 having the two termination positions is set to the same as that of the termination resistors in the arrangement of FIG. 14 and the resistance of the termination resistors in the arrangement of FIG. 24 having the one termination position is set to a half of that of the termination resistors in the arrangement of FIG. 14, so that the signal amplitude on the transmission line 111 becomes the same value as that on the transmission line 100.

The number of mounted components in the arrangement of FIG. 22 is small in the same manner as that of the arrangement of FIG. 20 but the time required to suppress the reflection of the signal is increased double as compared with the arrangement of FIG. 20.

The time required to suppress the reflection of the signal in the arrangement of FIG. 24 is double as compared with the arrangement of FIG. 20 but the number of mounted components (termination resistors) is extremely small.

Since the arrangement of FIG. 26 is terminated at the near end and the far end, the reflection is advantageously suppressed as compared with the arrangement of FIG. 24.

Figure 28:
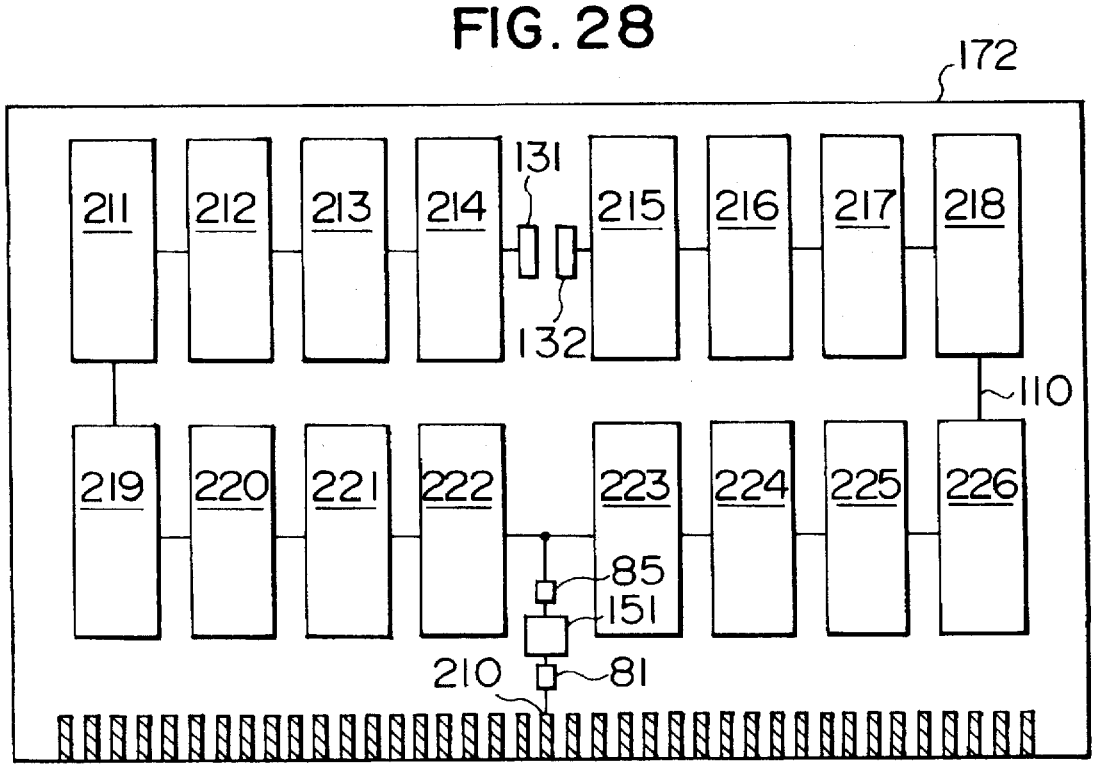
Figure 29:
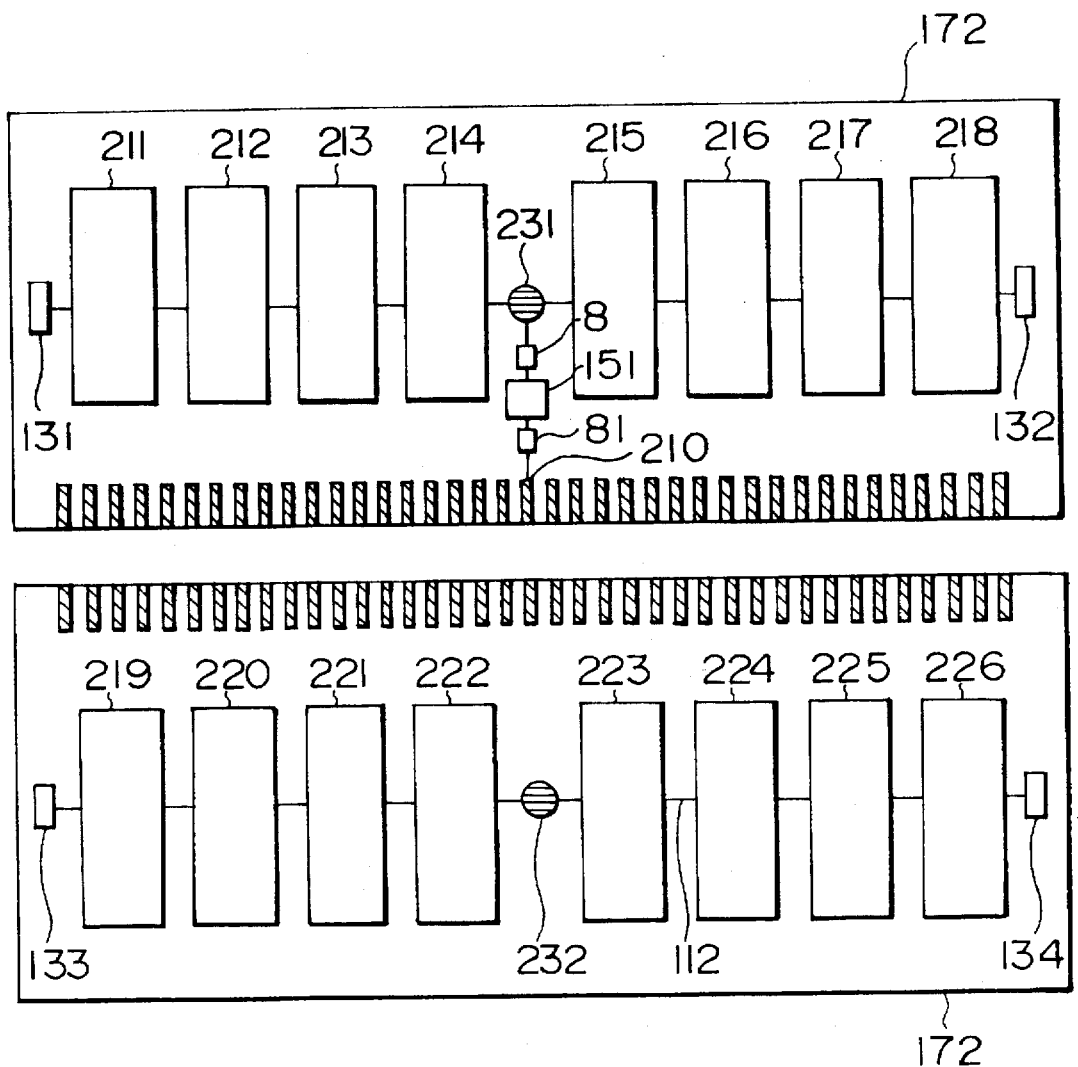

In addition, FIG. 28 shows another module in which the ring transmission line 111 is disconnected at the far end and the disconnected transmission lines are terminated at the disconnected ends. FIG. 29 shows another module having both sides on which components are mounted and which are connected by means of a through-hole 231.

The arrangement of FIG. 28 has a large termination effect as compared with the ring wiring or looped transmission line shown in FIGS. 22, 24 and 26. In the arrangement of FIG. 29, LSI's can be mounted on both sides of the board.

In addition to the modules shown in the above embodiments, various combined modules such as, for example, a module including the modules of FIG. 16 mounted on both sides can be considered and the modules described above are only part thereof. Further, in FIG. 29, the through-hole is provided in the transmitting end, while the through-hole may be provided in the far end and it is needless to say that the present invention is not limited to the position of the through-hole.

Figure 30:
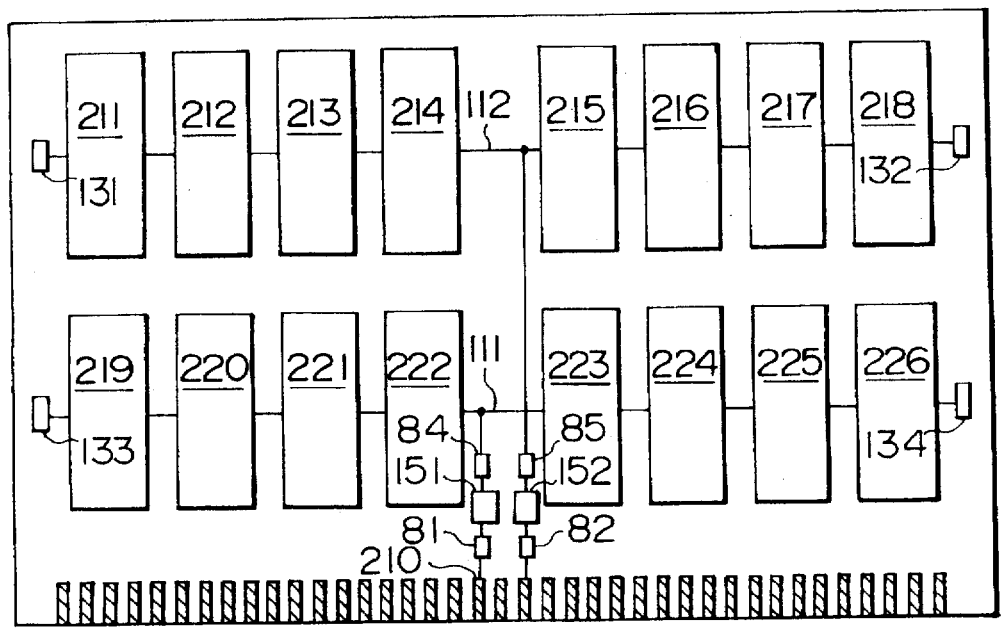
Figure 31:
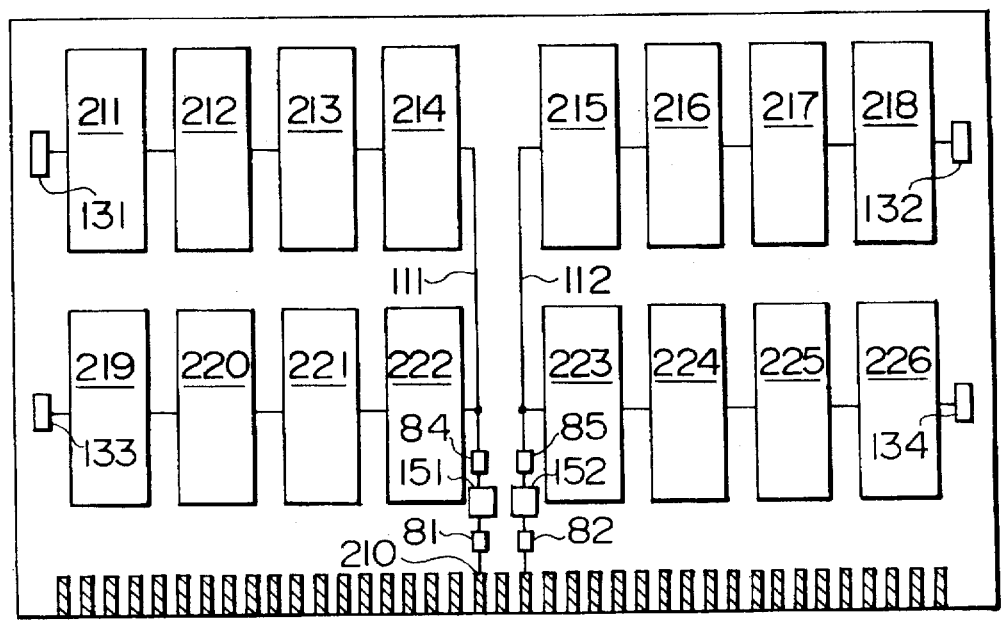

In the above embodiments, one signal is transmitted to all of the circuit elements 211 to 226, while the present invention is effective for the signal transmitted on a part of a module as shown in FIGS. 30 and 31.

With the arrangement shown in FIGS. 30 and 31, even a double-line module can have the same load capacitance as that of a single-line module, so that it is advantageous to the high-speed operation.

Figure 32:
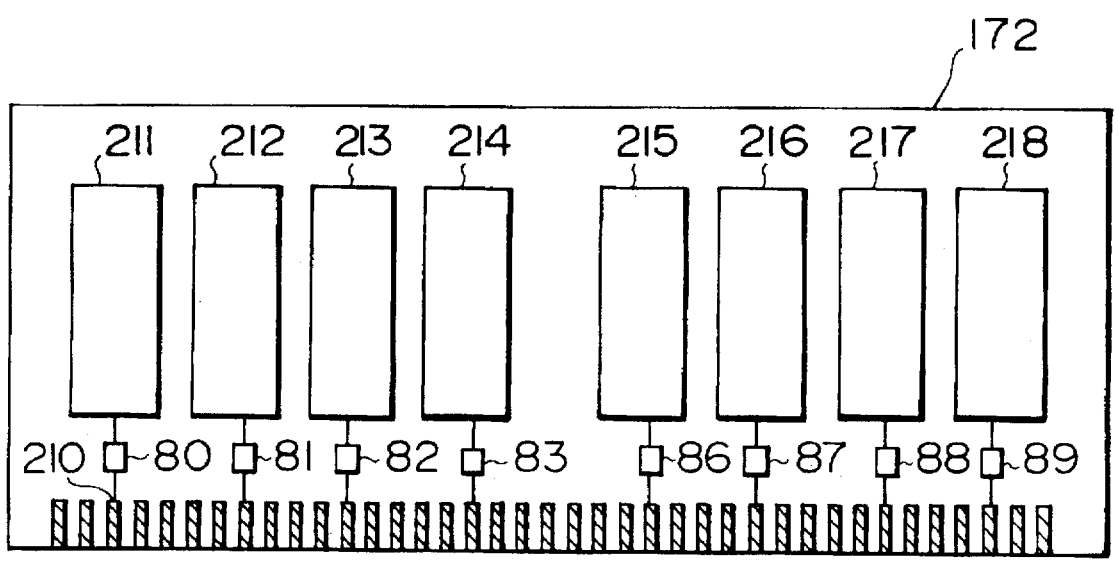

Finally, in a circuit in which separate signals are transmitted in separate circuit elements as in a data bus, connection may be made from input/output terminals 210 of a module through resistors 80–83 and 86–89 to circuit elements 211 to 218 directly as shown in FIG. 32.

What is claimed is:

1. A signal transmitting device comprising:
   a main transmission line terminated by a first element having a resistance close to an impedance value of said main transmission line;

a first circuit block connected to said main transmission line, said first circuit block including:
   a driving circuit for driving a signal; and
   a first intra-block transmission line for transmitting the signal outputted from said driving circuit to the main transmission line, said first intra-block transmission line including a second element having a resistance equal to or close to a value derived by subtracting a half of the impedance value of said main transmission line from an impedance value of said first intra-block transmission line;
a second circuit block connected to said main transmission line, said second circuit block including:
   a second intra-block transmission line for transmitting a signal inputted from said main transmission line to a transmitting/receiving circuit and including a third element having a resistance substantially equal to the value derived by subtracting a half of the impedance value of said main transmission line from the impedance value of said second intra-block transmission line;
   a third intra-block transmission line for transmitting the signal outputted from said transmitting/receiving circuit and providing the signal to a receiving circuit, and including a fourth element connected to said third intra-block transmission line for terminating said third intra-block transmission line; and
   a fifth element connected between said transmitting/receiving circuit and said third intra-block transmission line for reducing the voltage of the signal outputted from the transmitting/receiving circuit which is applied to the third intra-block transmission line.

2. A signal transmitting device according to claim 1, wherein a reference voltage used in said receiving circuit and said transmitting/receiving circuit is supplied from outside of said receiving circuit and said transmitting/receiving circuit.

3. A signal transmitting device according to claim 1, wherein a ratio of the impedance value of said main transmission line and the impedance value of said first and second intra-block transmission lines is defined by a ratio of a signal amplitude on said main transmission line and a power supply voltage for driving said driving circuit.

4. A signal transmitting device according to claim 3, wherein the ratio of the impedance value of said main transmission line and the impedance value of said first and second intra-block transmission lines is about twice the ratio of the signal amplitude on said main transmission line and the power supply voltage for driving said driving circuit.

5. A signal transmitting device according to claim 1, wherein the resistances of said first and fourth elements are equal to each other and the resistances of said second, third and fifth elements are equal to each other.

6. A signal transmitting device according to claim 1, wherein said driving circuit comprises an output circuit of a memory control LSI (Large Scale Integration Device), said transmitting/receiving circuit comprises a buffer LSI and said receiving circuit comprises a memory system comprised of memory LSI's.

7. A signal transmitting device according to claim 1, wherein said fourth element is provided at each of both ends of said third intra-block transmission line.

8. A signal transmitting device according to claim 1, wherein said fourth element is provided at a transmitting end of said third intra-block transmission line to which said third intra-block transmission line and an output end of said transmitting/receiving circuit are connected.

9. A signal receiving module connected to a main transmission line terminated by a first element having a resistance equal to or close to an impedance value of said main transmission line, comprising:
   a first intra-block transmission line for transmitting a signal inputted from said main transmission line to a transmitting/receiving circuit, and including a second element having a resistance equal to or close to a value derived by subtracting a half of the impedance value of said main transmission line from an impedance value of said first intra-block transmission line;
   a second intra-block transmission line for transmitting a signal from said transmitting/receiving circuit to a receiving circuit and including a third element connected to said second intra-block transmission line for terminating said second intra-block transmission line; and
   a fourth element connected between said transmitting/receiving circuit and said second intra-block transmission line for reducing the voltage of the signal outputted from the transmitting/receiving circuit which is applied to the second intra-block transmission line.

10. A signal receiving module according claim 9, wherein a reference voltage used in said receiving circuit and said transmitting/receiving circuit is supplied from outside of said receiving circuit and said transmitting/receiving circuit.

11. A signal receiving module according to claim 9, wherein said third element is provided at each of both ends of said second intra-block transmission line.

12. A signal receiving module according to claim 9, wherein said third element is provided at a transmitting end of said second intra-block transmission line to which said second intra-block transmission line and an output end of said transmitting/receiving circuit are connected.

13. A signal receiving module according to claim 9, wherein said transmitting/receiving circuit comprises a buffer LSI (Large Scale Integration Device), and wherein said receiving circuit comprises a memory system comprised of a plurality of memory LSIs.

14. A signal transmitting device comprising:
   a main transmission line including a first element for terminating said main transmission line;
   a first circuit block connected to said main transmission line, said first circuit block including:
      a driving circuit for driving a signal; and
      a first intra-block transmission line for transmitting the signal outputted from said driving circuit to said main transmission line and including a second element for producing a voltage drop thereacross; and
   a second circuit block connected to said main transmission line, said second circuit block including:
      a second intra-block transmission line for transmitting a signal inputted from said main transmission line to a transmitting/receiving circuit, and including a third element for producing a voltage drop thereacross;
      a third intra-block transmission line for transmitting a signal outputted from said transmitting/receiving circuit to a receiving circuit and including a fourth element connected to said third intra-block transmission line for terminating said third intra-block transmission line; and
      a fifth element connected between said transmitting/receiving circuit and said third intra-block transmission line for reducing the voltage of the signal outputted from the transmitting/receiving circuit which is applied to the third intra-block transmission line;

resistances of said first and fourth elements being equal to each other, resistances of said second, third and fifth elements being equal to each other.

15. A signal transmitting device according to claim 14, wherein resistance of said first element is substantially equal to an impedance value of said main transmission line and the resistance of said second element is substantially equal to the value derived by subtracting a half of the impedance value of said main transmission line from the impedance value of said intra-block transmission line.

16. A signal transmitting device according to claim 14, wherein said driving circuit comprises an output circuit of a memory control LSI (Large Scale Integration Device), said transmitting/receiving circuit comprises a buffer LSI and said receiving circuit comprises a memory system comprised of memory LSIs.

17. A signal transmitting device, comprising:
a main transmission line terminated by a first element having a resistance close to an impedance value of said main transmission line;
a first circuit block connected to said main transmission line, said first circuit block including:
a driving circuit for driving a signal; and
a first intra-block transmission line for transmitting the signal outputted from said driving circuit and including a second element having a resistance set to suppress signal reflexions at branching points;
a second circuit block being a memory module and connected to said main transmission line, said second circuit block including:
a transmitting/receiving circuit for receiving a signal and transmitting said received signal;
a second intra-block transmission line for transmitting a signal inputted from said main transmission line to said transmitting/receiving circuit and including a third element having a resistance set to suppress signal reflexions at branching points,
a receiving circuit for receiving the signal outputted from said transmitting/receiving circuit;
a third intra-block transmission line for transmitting a signal between said transmitting/receiving circuit and said receiving circuit; and
a fourth element connected between said transmitting/ receiving circuit and said third intra-block transmission line for producing a voltage drop thereacross.

18. A device according to claim 17, wherein a reference voltage used in said receiving circuit and said transmitting/ receiving circuit is supplied from the outside of said receiving circuit and said transmitting/receiving circuit.

19. A device according to claim 17, wherein a ratio of the impedance value of said main transmission line and the impedance value of said first and second intra-block transmission lines is defined by a ratio of a signal amplitude on said main transmission line and a power supply voltage for driving said driving circuit.

20. A device according to claim 17, wherein the ratio of the impedance value of said main transmission line and the impedance value of said first and second intra-block transmission lines is about twice the ratio of the signal amplitude on said main transmission line and the power supply voltage for driving said driving circuit.

21. A device according to claim 17, wherein the resistance of said second, third and fourth elements are equal to each other.

22. A device according to claim 17, wherein said driving circuit comprises an output circuit of a memory control LSI, said transmitting/receiving circuit comprises a buffer LSI and said receiving circuit comprises a memory system constituted by memory LSIs.

23. A device according to claim 17, wherein a fifth element is provided at each of both ends of said third intra-block transmission line for termination.

24. A device according to claim 17, wherein a fifth element is provided for termination at a transmitting end of said third intra-block transmission line to which said third intra-block transmission line and an output end of said transmitting/receiving circuit are connected.

25. A device according to claim 17, wherein resistances of said second, third and fourth elements are equal to each other.

26. A memory module connectable to a main transmission line terminated by a first element having a resistance equal to or close to an impedance value of said main transmission line, comprising:
a transmitting/receiving circuit for receiving a signal and transmitting said received signal;
a first intra-block transmission line for transmitting a signal inputted from said main transmission line to said transmitting/receiving circuit and including a second element having a resistance in order to suppress signal reflexions at branching points,
a receiving circuit for receiving the signal outputted from said transmitting/receiving circuit;
a second intra-block transmission line for transmitting a signal between said transmitting/receiving circuit and said receiving circuit, and
a third element connected between said transmitting/ receiving circuit and said second intra-block transmission line for producing a voltage drop thereacross.

27. A module according to claim 26, wherein a reference voltage used in said receiving circuit and said transmitting/ receiving circuit is supplied from the outside of said receiving circuit and said transmitting/receiving circuit.

28. A module according to claim 26, wherein a fourth element is provided at each of both ends of said second intra-block transmission line for termination.

29. A module according to claim 26, wherein a fourth element is provided for termination at a transmitting end of said second intra-block transmission line to which said second intra-block transmission line and an output end of said transmitting/receiving circuit are connected.

* * * * *